(12) United States Patent  (10) Patent No.: US 12,286,359 B2
Lee et al.  (45) Date of Patent: Apr. 29, 2025

(54) PEROVSKITE LIGHT-EMITTING DEVICE HAVING PASSIVATION LAYER AND FABRICATION METHOD THEREOF

(71) Applicant: SEOUL NATIONAL UNIVERSITY R&DB FOUNDATION, Seoul (KR)

(72) Inventors: Tae-Woo Lee, Seoul (KR); Jin Woo Park, Seoul (KR); Young-Hoon Kim, Seoul (KR); Sungjin Kim, Seoul (KR)

(73) Assignee: SEOUL NATIONAL UNIVERSITY R&DB FOUNDATION (KR)

( * ) Notice: Subject to any disclaimer, the term of this patent is extended or adjusted under 35 U.S.C. 154(b) by 0 days.

(21) Appl. No.: 17/541,241

(22) Filed: Dec. 2, 2021

(65) Prior Publication Data

US 2022/0169526 A1 Jun. 2, 2022

(30) Foreign Application Priority Data

Dec. 2, 2020 (KR) .................. 10-2020-0166340
Dec. 1, 2021 (KR) .................. 10-2021-0170416

(51) Int. Cl.
*H01L 51/50* (2006.01)
*C01G 21/00* (2006.01)
*C09K 11/66* (2006.01)
*H10K 50/805* (2023.01)
*H10K 50/84* (2023.01)
*H10K 71/12* (2023.01)
*H10K 85/00* (2023.01)
*H10K 50/115* (2023.01)

(52) U.S. Cl.
CPC .......... *C01G 21/006* (2013.01); *C09K 11/665* (2013.01); *H10K 50/805* (2023.02); *H10K 50/84* (2023.02); *H10K 71/12* (2023.02); *H10K 85/00* (2023.02); *C01P 2002/34* (2013.01); *C01P 2004/62* (2013.01); *H10K 50/115* (2023.02)

(58) Field of Classification Search
None
See application file for complete search history.

(56) References Cited

U.S. PATENT DOCUMENTS

2022/0029118 A1\* 1/2022 Lee .................. H10K 71/00

\* cited by examiner

*Primary Examiner* — Gregory D Clark
(74) *Attorney, Agent, or Firm* — Renaissance IP Law Group LLP

(57) ABSTRACT

Disclosed is a perovskite light-emitting device with reduced defects in a perovskite thin film. The passivation layer in the perovskite light-emitting device is formed on the upper part of the perovskite thin film to eliminate defects in the perovskite nanocrystalline particles and resolve charge imbalance in the device, thereby improving maximum efficiency and maximum luminance of the light-emitting device.

21 Claims, 16 Drawing Sheets (a)

(b)

(c)

(a)

(b)

PEROVSKITE LIGHT-EMITTING DEVICE HAVING PASSIVATION LAYER AND FABRICATION METHOD THEREOF

TECHNICAL FIELD

The present invention relates to a perovskite light-emitting device, and more particularly, to a perovskite light-emitting device in which a passivation layer is formed on a perovskite thin film to reduce defects in the perovskite thin film.

BACKGROUND ART

Recently, the megatrend in the display market is moving from the liquid crystal display to the organic light-emitting diode. Organic light-emitting diode (OLED) based on an organic light emitter has made a leap forward, and an inorganic quantum dot LED with improved color purity is being actively researched and developed as another alternative. However, both the organic and the inorganic quantum dot light emitters have inherent limitations in terms of materials.

Existing organic light emitters have high efficiency, but their color purity is not good due to their wide spectrum. In addition, inorganic quantum dot emitters have been known to have good color purity, but because they emit light by quantum confinement effect or quantum size effect, the emission color changes according to the size of the nanocrystalline particle which are mainly of diameters of 10 nm or less, but there is a problem in that the color purity decreases because it is difficult to control the quantum dot size to be uniform as it goes toward the blue color. Moreover, since the inorganic quantum dots have a very deep valence band, there is a problem in that hole injection is difficult because the hole injection barrier at the interface with the organic hole injection layer is very large. In addition, the organic light emitters and the inorganic quantum dot light emitters have a disadvantage of being expensive.

Accordingly, there is a need for a new type of organic-inorganic hybrid light emitters that compensates for the shortcomings of the organic light emitters and the inorganic quantum dot emitters and still maintains their advantages.

On the other hand, organic-inorganic hybrid materials have the advantages of low manufacturing costs, simple manufacturing and device fabrication processes, and the advantages of organic materials that are easy to control optical and electrical properties, and of inorganic materials having high charge mobility and mechanical and thermal stability. It is in the spotlight academically and industrially because you can have both advantages of organic and inorganic light emitters.

Among them, the metal halide perovskite material has a high color purity, simple color control, and low synthesis cost, so the possibility of development as a light emitter is very high. In addition, since it has a high color purity (Full width at half maximum (FWHM)≈20 nm), it is possible to implement a light-emitting device that emit a color closer to natural color.

Since metal halide perovskite has an organoammonium ($RNH_3$) cation or metal cation at the A site in the $ABX_3$ structure, and halide anions (Cl—, Br—, I—) are located at the X site, the composition is completely different from that of the inorganic metal oxide perovskite material.

In addition, the properties of the material vary depending on the difference in the constituent material. Inorganic metal oxide perovskite typically exhibits superconductivity, ferroelectricity, and huge magnetoresistance.

On the other hand, metal halide perovskite is similar to lamellar crystal structure because the organic or alkali metal plane and the inorganic plane are stacked alternately, so the excitons can be confined within the inorganic plane of the crystal. Therefore, since the properties of the metal halide perovskite are essentially determined by the crystal structure rather than the size of the material, the metal halide perovskite itself can be an ideal light emitter that emits light of very high color purity.

Even in organic-inorganic hybrid perovskite (i.e., organometal halide perovskite) among metal halide perovskite materials, if organic ammonium (A) contains a chromophore (mainly including a conjugated structure) which have a smaller band gap than the central metal-halogen crystal structure ($BX_3$), the light emission comes from the organic ammonium and thus high color purity of the light cannot be obtained, and the full-width-at-half-maximum (FWHM) of the emission spectrum becomes wider than 50 nm, making it unsuitable as a light emitting layer. Therefore, in this case, it is not very suitable for the high color purity emitters emphasized in this patent. Therefore, in order to make a high-color-purity light emitters, it is important that organic ammonium does not contain a chromophore and that light emission occurs in an inorganic lattice composed of a central metal-halogen element. In other words, this patent focuses on the development of high color purity and high efficiency light emitters that emit light that originates from an inorganic lattice.

For example, Korean Publication Patent No. 10-2001-0015084 (Feb. 26, 2001) discloses an electroluminescent device using a dye-containing organic-inorganic hybrid material as a light emitting layer by forming their thin film instead of particles. It does not emit light from the perovskite lattice structure.

However, since metal halide perovskite has small exciton binding energy, it is possible to emit light at low temperatures, but at room temperature, excitons do not undergo light emission due to thermal ionization and delocalization of charge carriers: this is a fundamental problem. In addition, when free charges recombine to form excitons, there is a problem in that excitons are quenched by a layer having a high conductivity adjacent to them, and thus light emission cannot occur.

Perovskite nanocrystalline particles with improved properties that can be applied to various electronic devices show improved luminescence efficiency by confining excitons to a very small size. Also, a bulk polycrystalline film having a very small grain size of 100 nm or less may exhibit improved luminous efficiency through exciton confinement. In addition, exciton confinement can occur well even in perovskite nanocrystalline particles having a size of several nm to several tens of nm, so that nanocrystalline particles in the 3 nm-20 nm region show high luminescence efficiency. However, the perovskite light emitting layer exhibits relatively low luminescence efficiency due to the presence of surface defects, and exhibits low luminescence efficiency due to charge carrier imbalance in the light-emitting device.

Accordingly, there is a need for a method capable of eliminating defects in the perovskite thin film and resolving charge imbalance in the light-emitting device.

DISCLOSURE

Technical Problem

A first object of the present invention is to provide a light-emitting device including a passivation layer that can reduce the defects of the perovskite thin film and solve the charge imbalance.

A second object of the present invention is to provide a method of manufacturing a light-emitting device including the passivation layer.

Technical Solution

In order to achieve the first object, the present invention provides a perovskite light-emitting device comprising a substrate; a first electrode positioned on the substrate; a perovskite thin film positioned on the first electrode; a passivation layer positioned on the perovskite thin film and comprising the following passivation material (1) or passivation material (2); and a second electrode positioned on the passivation layer.

The passivation material (1) includes organic material or compound of Formula 1 below.

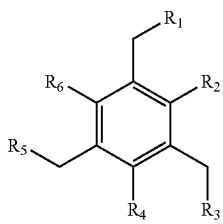

Formula 1

In Formula 1, $R_1$, $R_3$ or $R_5$ is an alkyl group having 1 to 10 carbon atoms, an alkenyl group or alkynyl group having 2 to 10 carbon atoms, a cycloalkyl group having 3 to 10 carbon atoms, a cycloalkenyl group or a heteroalkenyl group having 3 to 10 carbon atoms, an aryl group or aryloxy group having 6 to 30 carbon atoms, or a heteroaryl group having 2 to 30 carbon atoms, and $R_2$, $R_4$ or $R_6$ is a halogen or a halogenated alkyl group having 1 to 10 carbon atoms, a halogenated alkenyl group or halogenated alkynyl group having 2 to 10 carbon atoms.

The passivation material (2) includes a mixture of a compound of Formula 2, Formula 3, or Formula 4 below, and organic material including at least one selected from organic semiconductors and polymers.

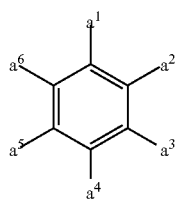

Formula 2

In Formula 2, $a^1$ to $a^6$ are each independently an alkyl group or alkoxy group having 1 to 10 carbon atoms, an alkenyl group or alkynyl group having 2 to 10 carbon atoms, a cycloalkyl group or cycloalkenyl group having 3 to 10 carbon atoms, halogen, an alkenyl group or alkynyl group having 2 to 10 carbon atoms, a cycloalkyl group having 3 to 10 carbon atoms, a cycloalkenyl group or heteroalkenyl group having 3 to 10 carbon atoms, or an aryl group or aryloxy group having 6 to 30 carbon atoms.

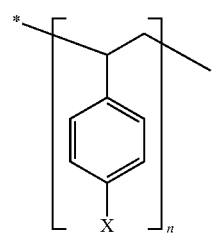

Formula 3

In Formula 3, X is halogen elements, and n is an integer from 1 to 100.

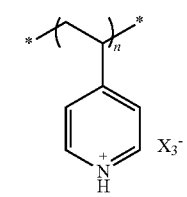

Formula 4

In Formula 4, X is halogen elements, and n is an integer from 1 to 100.

Also preferably, the passivation layer may include a compound of Formula 5 below.

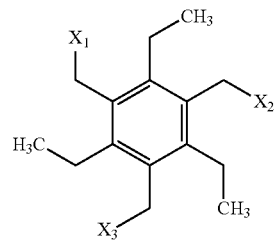

Formula 5

In Formula 5, $X_1$, $X_2$ or $X_3$ is F, Cl, Br or I.

Also preferably, $X_1$, $X_2$ and $X_3$ may be the same halogen element.

Also preferably, the mixture of (2) can include compounds represented by Formula 2, Formula 3 or Formula 4; and organic material comprising at least one selected from organic semiconductors and polymers in a molar ratio of 1:0.7 to 1.4.

Also preferably, a hole injection layer or an electron transport layer may be further included between the first electrode and the perovskite thin film, or between the passivation layer and the second electrode.

Also preferably, the perovskite thin film includes perovskite nanocrystalline particles, and the perovskite nanocrystalline particles may include the perovskite nanocrystals and organic ligands bonded to a surface of the perovskite nanocrystal.

Also preferably, the perovskite nanocrystalline particle may have a core-shell structure.

Also preferably, the perovskite nanocrystalline particle may have a gradient composition.

Also preferably, the perovskite nanocrystalline particle may have a diameter larger than the exciton Bohr diameter.

In addition, in order to achieve the second object, the present invention provides a method of manufacturing a perovskite light-emitting device that includes a step of forming a first electrode on a substrate; a step of forming a perovskite thin film on the first electrode; a step of forming a passivation layer containing passivation material (1) or (2) on the perovskite thin film; and a step of forming a second electrode on the passivation layer.

The passivation material (1) includes organic material or compound of Formula 1 below.

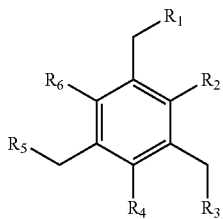

Formula 1

In Formula 1, $R_1$, $R_3$ or $R_5$ is an alkyl group having 1 to 10 carbon atoms, an alkenyl group or alkynyl group having 2 to 10 carbon atoms, a cycloalkyl group having 3 to 10 carbon atoms, a cycloalkenyl group or a heteroalkenyl group having 3 to 10 carbon atoms, an aryl group or aryloxy group having 6 to 30 carbon atoms, or a heteroaryl group having 2 to 30 carbon atoms, and $R_2$, $R_4$ or $R_6$ is a halogen or a halogenated alkyl group having 1 to 10 carbon atoms, a halogenated alkenyl group or halogenated alkynyl group having 2 to 10 carbon atoms.

The passivation material (2) includes a compound of Formula 2, Formula 3, or Formula 4 below, and organic material including at least one selected from organic semiconductors and polymers.

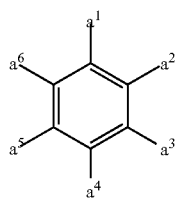

Formula 2

In Formula 2, $a^1$ to $a^6$ are each independently an alkyl group or alkoxy group having 1 to 10 carbon atoms, an alkenyl group or alkynyl group having 2 to 10 carbon atoms, a cycloalkyl group or cycloalkenyl group having 3 to 10 carbon atoms, halogen, an alkenyl group or alkynyl group having 2 to 10 carbon atoms, a cycloalkyl group having 3 to 10 carbon atoms, a cycloalkenyl group or heteroalkenyl group having 3 to 10 carbon atoms, or an aryl group or aryloxy group having 6 to 30 carbon atoms.

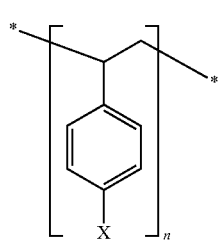

Formula 3

In Formula 3, X is halogen elements, and n is an integer from 1 to 100.

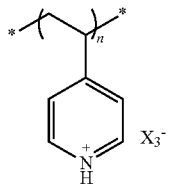

Formula 4

In Formula 4, X is halogen elements, and n is an integer from 1 to 100.

Also preferably, the perovskite thin film may be formed through spin coating.

Also preferably, the formation of the perovskite thin film includes a step of applying a perovskite nanocrystalline particle solution on the first electrode; a step of allowing a holding time (waiting time) or drying time to the perovskite nanocrystalline particle solution applied on the electrode; and after the holding time is over, a step of spinning the perovskite nanocrystalline particle solution through a spin coater to perform spin coating.

Also preferably, the holding time may be 2 minutes to 25 minutes.

Also preferably, the perovskite thin film may be formed through bar coating.

Also preferably, a method manufacturing the bar coating includes a step of applying a perovskite nanocrystalline particle solution on the first electrode; a step of tilting the first electrode that is applied the perovskite nanocrystalline particle solution by giving an inclination angle with respect to the horizontal plane; and a step of performing bar coating of the perovskite nanocrystalline particle solution on the tilted first electrode.

Also preferably, the holding time may be given after the step of applying the perovskite nanocrystalline particle solution.

Also preferably, the passivation layer may include a compound of Formula 5 below.

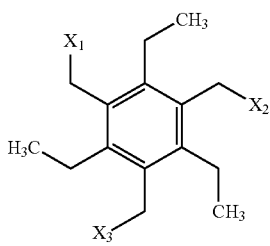

Formula 5

In Formula 5, $X_1$, $X_2$ or $X_3$ is F, Cl, Br or I.

Also preferably, $X_1$, $X_2$ and $X_3$ may be the same halogen elements.

Advantageous Effects

According to the present invention, the passivation layer in the perovskite light-emitting device is formed on the perovskite thin film to eliminate the defects of the perovskite nanocrystalline particles and to resolve the charge imbalance within the device, thereby improving maximum efficiency and maximum luminance of the light-emitting device including the perovskite thin film.

The technical effects of this invention are not limited to those mentioned above, and other technical effects that are not mentioned will be clearly understood by those skilled in the art from the following description.

MODES OF THE INVENTION

Figure 1:
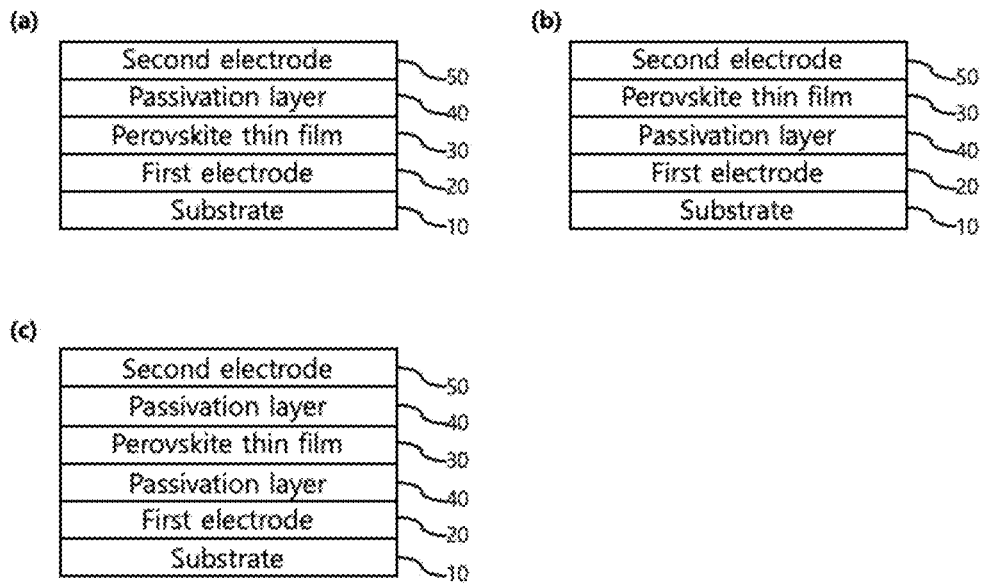
FIG. 1 is a cross-sectional view illustrating a perovskite light-emitting device of the present invention.

Hereinafter, embodiments according to the present invention will be described in detail with reference to the accompanying drawings as follows.

While the invention is susceptible to various modifications and variations, specific embodiments thereof are illustrated and shown in the drawings and will be described in detail below. However, it is not intended to limit the invention to the particular form disclosed, but rather the invention includes all modifications, equivalents and substitutions consistent with the spirit of the invention as defined by the claims.

When an element, such as a layer, area, or substrate, is referred to as being "on" another component, it will be understood that it may be directly present on or between the other elements.

Although terms, such as first and second, may be used to describe various elements, components, regions, layers and/ or areas, it will be understood that these elements, components, regions, layers and/or areas should not be limited by these terms.

The present invention provides a perovskite light-emitting device including a passivation layer.

The light-emitting device refers to a device that converts an electrical signal into light, and may include devices that emit light such as light-emitting diodes, light-emitting transistors, lasers, polarized light-emitting devices, or the like.

The perovskite light-emitting device according to the present invention includes a perovskite thin film as a light-emitting layer, and is characterized in that a passivation layer is formed on the perovskite thin film.

FIG. 1 is a cross-sectional view illustrating a perovskite light-emitting device of the present invention.

Referring to FIG. 1(a), the perovskite light-emitting device according to the present invention includes a substrate 10, a first electrode 20, a perovskite thin film 30, a passivation layer 40, and a second electrode 50.

The substrate 10 serves as a support for the light-emitting device, and may be a transparent material. In addition, the substrate 10 may be a flexible material or a hard material, and preferably may be a flexible material. The material of the substrate 10 is one of glass, sapphire, quartz, silicon, polyethylene terephthalate (PET), polystyrene (PS), polyimide (polyimide, PI), polyvinyl chloride (PVC), polyvinylpyrrolidone (PVP), polyethylene (PE), and the like. However, the present invention is not limited thereto, and the substrate may be a metal substrate capable of light reflection.

The first electrode 20 may be positioned on the substrate 10.

The first electrode 20 is an electrode (anode) into which holes are injected, and is made of a material having conductive properties. The material constituting the first electrode 20 may be a conductive metal oxide, a metal, a metal alloy, or a carbon material. The conductive metal oxide may include indium tin oxide (ITO), fluorine tin oxide (FTO), antimony tin oxide (ATO), fluoride doped oxide (FTO), $SnO_2$, ZnO, or a combination thereof. Metals or metal alloys suitable as anodes may include Au and CuI. The carbon material may be graphite, graphene, or carbon nanotubes.

If the light-emitting device is a light-emitting diode, when a conductive polymer is used as the first electrode 20, the perovskite thin film may be directly formed as a light-emitting layer on the first electrode 20 without additional deposition of a hole injection layer. On the other hand, when a type of electrode other than the conductive polymer is used as the first electrode 20, it may be necessary to introduce the hole injection layer on the first electrode 20.

Subsequently, a perovskite thin film 30 may be positioned on a first electrode 20.

The perovskite thin film 30 serves as the light-emitting layer in the light-emitting device of the present invention, and may be made of organic/inorganic hybrid perovskite or inorganic metal halide perovskite.

A passivation layer 40 is disposed on the perovskite thin film 30.

The passivation layer includes the following passivation material (1) or (2).

Passivation material (1) has a compound represented by Formula 1 below.

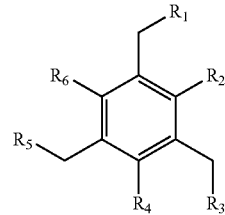

Formula 1

In Formula 1, $R_1$, $R_3$ or $R_5$ is an alkyl group having 1 to 10 carbon atoms, an alkenyl group or alkynyl group having 2 to 10 carbon atoms, a cycloalkyl group having 3 to 10 carbon atoms, a cycloalkenyl group or a heteroalkenyl group having 3 to 10 carbon atoms, an aryl group or aryloxy group having 6 to 30 carbon atoms, or a heteroaryl group having 2 to 30 carbon atoms.

In this case, the "alkyl group" refers to a hydrocarbon formed of a single bond, the "alkenyl group" refers to a hydrocarbon containing at least one double bond in the structure, and the "alkenyl group" refers to a hydrocarbon containing at least one triple bond in the structure, and the "cycloalkyl group" refers to aromatic hydrocarbon formed of a single bond, "cycloalkenyl group" is an aromatic hydrocarbon containing at least one double bond, "aryl group" "is a functional group in which one hydrogen atom has been removed from an aromatic hydrocarbon (eg, phenyl, tolyl group, xylene group, naphthyl group), "aryloxy group" is an alkyl (carbon and hydrogen chain) group bonded to oxygen, "heteroaryl group" (in each separate ring in the case of multiple rings) refers to an aryl group (or ring) containing 1 to 4 heteroatoms selected from N, O and S, the "halogenation" includes at least one halogen in the structure means to do.

$R_2$, $R_4$ or $R_6$ is a halogen or a halogenated alkyl group having 1 to 10 carbon atoms, a halogenated alkenyl group or halogenated alkynyl group having 2 to 10 carbon atoms. The passivation layer of this invention may be embodied by including the aforementioned structure, but more desirably, $R_1$, $R_3$, or $R_5$ is $CH_3$, $C_2H_5$, $C_3H_7$, $C_4H_9$, or a phenyl group, and $R_2$, $R_4$ or $R_6$ is X, $CH_2X$, $C_2H_4X$ or $C_3H_6X$, and X is more desirably F, Cl, Br or I.

In particular, the passivation layer 40 can cure the surface defects of the perovskite thin film 30 functioning as the light-emitting layer by including the compound of Formula 5 below.

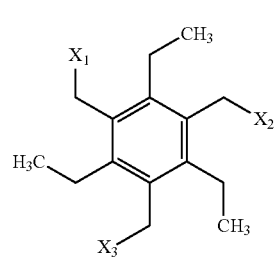

Formula 5

In Formula 5, $X_1$, $X_2$ or $X_3$ is F, Cl, Br or I. Also preferably, $X_1$, $X_2$ and $X_3$ may be the same halogen elements.

The passivation material 2 may be a mixture of a compound containing a halogen group and an organic material.

The mixture includes the compound containing a halogen group and an organic material.

First, the compound containing the halogen group refers to a compound including at least one halogen group in a structure, and more specifically, a compound represented by Formula 2, Formula 3, or Formula 4.

Formula 2

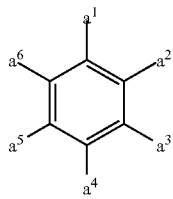

In Formula 2, $a^1$ to $a^6$ are each independently an alkyl group or alkoxy group having 1 to 10 carbon atoms, an alkenyl group or alkynyl group having 2 to 10 carbon atoms, a cycloalkyl group or cycloalkenyl group having 3 to 10 carbon atoms, an aryl group or aryloxy group having 6 to 30 carbon atoms, a heteroaryl group having 2 to 30 carbon atoms, halogen, a halogenated alkyl group having 1 to 10 carbon atoms, an halogenated alkenyl group or halogenated alkynyl group having 2 to 10 carbon atoms.

Desirably, $a^1$, $a^3$ or $a^5$ may be H, $CH_3$, $C_2H_5$, $C_3H_7$, $C_4H_9$, or phenyl group, and $a^2$, $a^4$ or $a^6$ may be X, $CH_2X$, $C_2H_4X$ or $C_3H_6X$, and X may be F, Cl, Br or I.

Formula 3

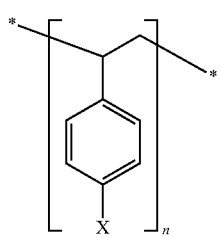

In Formula 3, X is halogen elements, and n is an integer from 1 to 100.

Formula 4

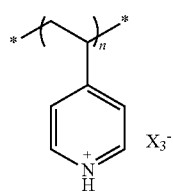

In Formula 4, X is halogen elements, and n is an integer from 1 to 100.

Also, more preferably, the compound containing the halogen group can be selected from 1,3,5-tris(bromomethyl)-2,4,6-triethylbenzene (TBTB), 1,3,5-tris(bromomethyl)benzene, 2,4,6-tris(bromomethyl)mesitylene (TBMM), 1,2,4,5-tetrakis (bromomethyl) benzene, hexakis (bromomethyl) benzene, poly (pentabromophenyl methacrylate), poly (pentabromobenzyl methacrylate), poly(pentabromobenzyl acrylate), poly(4-bromostyrene) and poly(4-vinylpyridinium tribromide), more preferably may be 2,4,6-tris(bromomethyl)mesitylene (TBMM).

Meanwhile, the compound or organic material containing the halogen group may include at least one selected from organic semiconductors and polymers. The organic semiconductor and the polymer added herein may improve dispersion of compounds or organic material containing the halogen group, and can control affinity (or adhesion, coating property, etc.) at an interface with the surface of the lower layer, and control charge balance in the device.

First, the organic semiconductor refers to a material that includes at least one aromatic hydrocarbon, has mobility of $10^{-8}$ $cm^2/V.s$ or more, and has an optical bandgap (measured as the rightmost onset value of the UV/Vis spectrum) exhibiting a value between 1.0 eV and 6.0 eV. Specifically, the organic semiconductor may include at least one selected from Tris-(8-hydroxyquinoline) aluminum (Alq3), 3-(4-Biphenylyl)-4-phenyl-5-tert-butylphenyl-1,2,4-triazole (TAZ), Tris-Phenylquinoxalines 1,3,5-tris[(3-phenyl-6-trifluoromethyl) quinoxaline-2-yl] benzene (TPQ1), Tris-Phenylquinoxalines 1,3,5-tris [{3-(4-tert-butyl)-6-trifluoromethyl} quinoxaline-2-yl] benzene (TPQ2), 4,7-diphenyl-1,10-phenanthroline (Bphen), 2,9-dimethyl-4,7-diphenyl-1,10-phenanthroline (BCP), 10-benzo[h]quinolinol-beryllium (BeBq2), (Bis(8-hydroxy-2-methylquinoline)-(4-phenylphenoxy)aluminum (BAlq), 4,4'-N,N'-Dicabazol-biphenyl (CBP), 9,10-di(naphthalene-2-yl)anthracene (AND), 4,4',4"-Tris(N-carbazolyl)triphenylamine (TCTA), 1,3,5-tris (N-phenylbenzimidazole-2-yl)benzene (TPBI), 3-tert-butyl-9,10-di(naphtha-2-il)anthracene (TBADN), (1,3,5-triazine-2,4,6-triyl) tris (benzene-3,1-dyle)tris (diphenylphosphine oxide), 2,4,6-tris [3-diphenylphosphinyl]phenyl-1,3,5-triazine (PO-T2T), Tris(2,4,6-trimethyl-3-(pyridin-3-yl)phenyl) borane (3TPYMB), 4,6-bis(3,5-di(pyridin-3-yl)phenyl)-2-methylpyrimidine (B3PYMPM), and 2-[4-(9,10-dinaphthalen-2-yl-anthracen-2-yl)-phenyl]-1-phenyl-1H-benzoimidazole (ZADN), preferably may include at least one selected from TPBI, PO-T2T, and ZADN, and more preferably may include at least one selected from TPBI and ZADN.

Also, the polymer may include at least one selected from poly (Methyl Methacrylate) (PMMA), poly (ethyl methacrylate) (PEMA), poly (butyl methacrylate (PBMA), poly (2-ethyl-2-oxazoline (PEOXA), polyacrylamide (PAM), and polyethylene oxide (PEO), preferably may include at least one selected from PMMA, PEOXA, and PEO, and more preferably may include at least one selected from PMMA and PEO.

Meanwhile, the mixture may include the compound or the organic material containing the halogen group in a molar ratio of 1:0.3 to 1:10.0, preferably 1:0.7 to 1:1.5, relative to the added organic semiconductor or polymer. In this case, when the compound or organic material having the halogen group are included in a molar ratio of less than 0.3, a defect passivation (or healing) effect by the compound or the organic material containing the halogen may be insignificant, and when it exceeds 10.0 molar ratio, a dispersion effect of the added organic semiconductor and polymer may be greatly reduced.

Through the above-described structure, the perovskite light-emitting device has a perovskite thin film in which surface defects are healed (or passivated), and high external quantum efficiency and current efficiency may be ensured.

In addition, by mixing the compound or the organic material containing the halogen group, the external quantum efficiency of the light-emitting device may be improved by simultaneously facilitating electron injection and perovskite defect healing (or defect passivation).

A second electrode is formed on the passivation layer 40.

Meanwhile, referring to FIGS. 1(b) and 1(c), in the perovskite light-emitting device according to the present invention, the passivation layer 40 using an organic material and/or the compound of the passivation material (1) or (2) may be formed between the first electrode 20 and the perovskite thin film 30, instead of being interposed between the perovskite thin film 30 and the second electrode 50 as with FIG. 1(a), in addition, in order to realize more complete passivation effect depending on the perovskite thin film material used, the passivation layer 40 may be simultaneously formed between the perovskite thin film 30 and the second electrode 50, as well as between the first electrode 20 and the perovskite thin film 30, as shown in FIG. 1(c).

Figure 2:
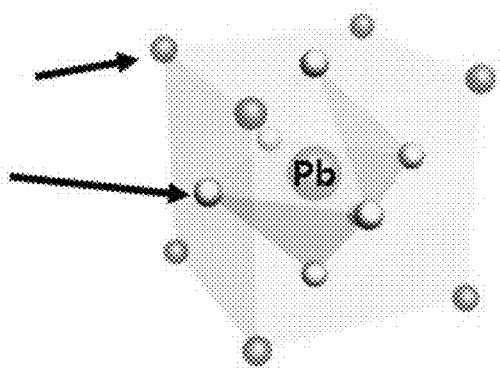
FIG. 2 is a schematic diagram of the crystal structure of the metal halide perovskite constituting the perovskite thin film in the perovskite light-emitting device according to the present invention.

FIG. 2 is a structure of a metal halide perovskite nanocrystal according to the present invention.

FIG. 2 shows the structures of organic/inorganic hybrid perovskite nanocrystals and inorganic metal halide perovskite nanocrystals.

Referring to FIG. 2, organic/inorganic hybrid perovskite nanocrystal has combined structure a face centered cubic (FCC) structure and body centered cubic structure (BCC), in which a central metal is positioned at the center, six inorganic halide materials (X) are located on all surfaces of the hexahedron, and organic ammoniums (OA) are located at all vertices of the hexahedron. Pb is shown as an example of the central metal.

In addition, the inorganic metal halide perovskite nanocrystal has a central metal at the center, six inorganic halide materials (X) are located on all surfaces of the hexahedron, and eight alkali metals are located at all vertices of the hexahedron. Pb is illustrated as an example of the central metal at this time.

At this time, all sides of the hexahedron form 90°, and include a cubic structure with the same horizontal length, vertical length, and height, as well as a tetragonal structure with the same horizontal length, vertical length but different height length.

Therefore, the two-dimensional structure according to the present invention has a central metal at the center, six inorganic halide materials are positioned on all surfaces of the hexahedron, and eight organic ammoniums are positioned at vertices of hexahedron. The organic/inorganic hybrid perovskite nanocrystal structure has the same width and depth, but height has 1.5 times longer than the width and depth.

The perovskite thin film may be a thin film formed of bulk polycrystals or nanocrystalline particles.

Figure 3:
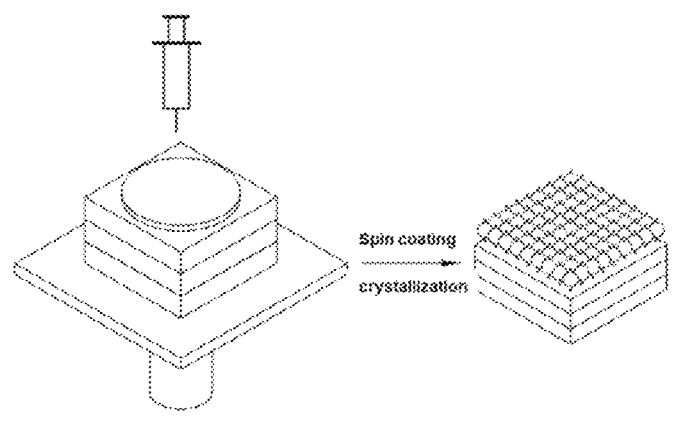
FIG. 3 is a schematic diagram showing the difference between the metal halide perovskite nanocrystalline particle emitter and the metal halide perovskite bulk polycrystalline thin film.
Figure 3:
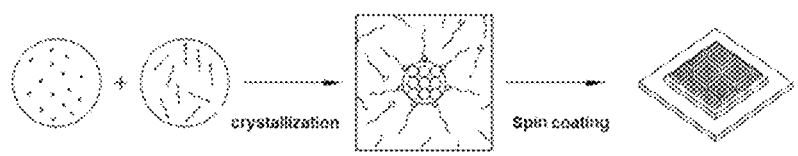

FIG. 3 is a schematic diagram showing differences between a perovskite bulk thin film and perovskite nanocrystalline particles according to the present invention.

As shown in FIG. 3(a), the perovskite bulk thin film is formed by simultaneously crystallizing and thin film coating, which is caused by evaporating a solvent in a spin coating process of a transparent ion type perovskite precursor. Therefore, since the bulk thin film is greatly affected by thermodynamic factors such as temperature and surface energy during a thin film formation process, a thin film formed is very non-uniform and is composed of large three-dimensional or two-dimensional polycrystals of several nm to hundreds of.

However, as illustrated in FIG. 3(b), the perovskite nanocrystalline particles are crystallized into particles having nm size in a colloidal solution and then stably dispersed in the solution by using a ligand. Since nanocrystalline particles are in a state in which crystallization is terminated in a solution, nanocrystalline particle thin film having a level of several nm may be formed without additional growth of crystals and maintained high light emission efficiency may be maintained.

Figure 4:
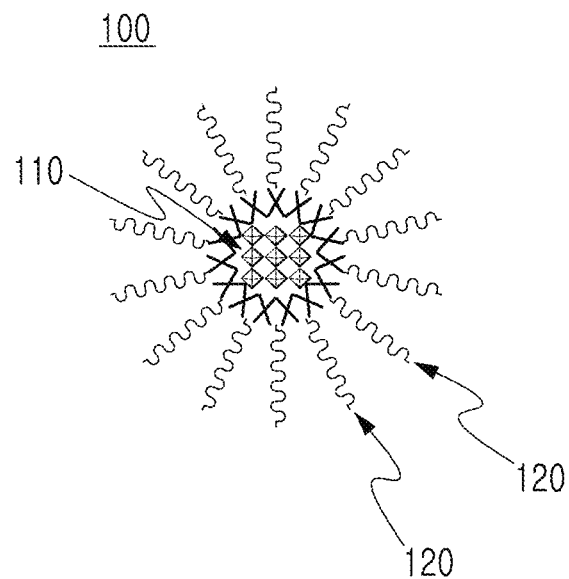
FIG. 4 is a schematic diagram showing the metal halide perovskite nanocrystalline particles light emitter constituting the perovskite thin film in the perovskite light-emitting device according to the present invention.

FIG. 4 is a schematic diagram showing metal halide perovskite nanocrystalline particles according to the present invention.

Meanwhile, FIG. 4 illustrates the organic/inorganic hybrid perovskite nanocrystalline particles. The inorganic metal halide perovskite nanocrystalline particle according to an embodiment of the present invention has an alkali metal instead of organic ammonium at the A site, and otherwise, it is the same as the description of the organic/inorganic hybrid perovskite nanocrystalline particles described above. In this case, the alkali metal material may be, for example, Na, K, Rb, Cs, or Fr.

Therefore, the organic/inorganic hybrid perovskite will be described as an example.

Referring to FIG. 4, the organic/inorganic hybrid perovskite nanocrystalline particles 100 according to the present invention may include a halide perovskite nanocrystal structure 110 that may be dispersed in an organic solvent. The organic solvent may be a polar solvent or a non-polar solvent.

For example, the polar solvent may include acetic acid, acetone, acetonitrile, dimethylformamide, gamma butyrolactone, N-methylpyrrolidone, ethanol or dimethylsulfoxide, and the non-polar solvent may include dichloroethylene, trichloroethylene, chloroform, chlorobenzene, dichlorobenzene, styrene, dimethylformamide, dimethyl sulfoxide, xylene, toluene, cyclohexene, or isopropyl alcohol, but is not limited thereto.

In addition, the nanocrystalline particles 100 may have a spherical, cylindrical, elliptical, or polygonal shape.

In addition, the size of the nanocrystalline particles may be 1 nm to 10 μm or less. For example, the size may be 1 nm, 3 nm, 5 nm, 6 nm, 7 nm, 8 nm, 9 nm, 10 nm, 11 nm, 12 nm, 13 nm, 14 nm, 15 nm, 16 nm, 17 nm, 20 nm, 25 nm, 30 nm, 35 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1 μm, 2 μm, 5 μm, or 10 μm. On the other hand, the size of the nanocrystalline particles means a size that does not take into account the length of a ligand to be described later, that is, the size of the remaining portions excluding the ligand.

For example, when the nanocrystalline particles are spherical, the diameter of the nanocrystalline particles may be 1 nm to 30 nm.

In addition, it is preferable that the nanocrystalline particles have a diameter larger than the exciton Bohr diameter. Accordingly, the light emission wavelength of the nanocrystalline particles may not depend on the size of particles, and the light emission wavelength may be determined by the composition of the nanocrystalline particles.

In addition, the band gap energy of the nanocrystalline particles may be 1 eV to 5 eV.

Accordingly, since the energy band gap is determined according to the constituent material or crystal structure of the nanocrystalline particles, light having a wavelength of, for example, 200 nm to 1300 nm may be emitted by controlling the constituent material of the nanocrystalline particles.

The halide perovskite material may be an organic/inorganic hybrid perovskite or an inorganic perovskite.

The perovskite material may include a structure of $ABX_3$ (3D), $A_4BX_6$(0D), $AB_2X_5$(2D), $A_2BX_4$(2D), $A_2BX_6$(0D), $A_2B^+B^{3+}X_6$(3D), $A_3B_2X_9$(2D), $A_{n+1}B_nX_{3n+1}$(quasi-2D), $A_{n-1}A'_2B_nX_{3n+1}$(quasi-2D) or $A''B_nX_{3n+1}$ (Dion-Jacobson (DJ) perovskite) (n is an integer between 1 and 6). In this case, A is an organic ammonium ion, organic amidinium ion, organic guanidium ion, organic phosphonium ion, alkali metal ion or derivatives thereof, A' is alkali metals, alkali earth metals, rare earth metals, long-chain organic cation (spacer), R—NH$_3$, or H$_3$N—R—NH$_3$ (R is a substituted or unsubstituted aliphatic hydrocarbon group of C$_1$ to C$_{24}$ or a substituted or unsubstituted aromatic hydrocarbon group of C$_5$ to C$_{24}$), A" is a divalent organic cation, and B may be a metal, a transition metal, a rare earth metal, an alkaline earth metal, an organic material, an inorganic material, ammonium, a derivative thereof, or a combination of two or more thereof, and X may be a halogen ion or a combination of different halogen ions.

Specifically, A is an amidinium-based organic material, an organic ammonium material, and an alkali ion, B is a metal material, and X is a halogen element.

More specifically, the amidinium-based organic material may be methylanilinium, formamidinium (NH$^+$), acetamidinium (NH$_2$C(CH)=NH$^{2+}$) or Guanidinium (NHC(NH)=NH$^+$), the organic ammonium material is (CH$_3$NH$_3$)$_n$, ((C$_x$H$_{2x+1}$)$_n$NH$_3$)$_2$(CH$_3$NH$_3$)$_n$, (RNH$_3$)$_2$, (C$_n$H$_{2n+1}$NH$_3$)$_2$, (CF$_3$NH$_3$), (CF$_3$NH$_3$)$_n$, ((C$_x$F$_{2x+1}$)$_n$NH$_3$)$_2$(CF$_3$NH$_3$)$_n$, ((C$_x$F$_{2x+1}$)$_n$NH$_3$)$_2$ or (C$_n$F$_{2n+1}$NH$_3$)$_2$) (n is an integer greater than or equal to 1 and x is an integer greater than or equal to 1).

The divalent organic cation may be selected from the group of (aminomethyl)piperidinium (3AMP), (aminomethyl)piperidinium (4AMP), 1,4-phenylenedimethanammonium (PDMA) and 1,4-bis(aminomethyl)cyclohexane (BAC).

In addition, B may be divalent transition metals, rare earth metals, alkaline earth metals, Pb, Sn, Ge, Ga, In, Al, Sb, Bi, Po, or combinations thereof. In this case, the rare earth metals may be, for example, Ge, Sn, Pb, Eu, or Yb. In addition, the alkaline earth metals may be, for example, Ca or Sr. In addition, by incorporating a metal such as Ag, Na, In, and Bi into the perovskite or into the perovskite with the above metal, double perovskites having two central metals or perovskite having more metal above may be formed.

In addition, X may be Cl, Br, I, or a combination thereof.

The size of the perovskite when nanocrystalline particles are formed may be controlled through a ligand length, a ligand density, and other reaction conditions (temperature, reaction time), for example, to 7 nm to 100 nm. More specifically, it can be controlled to 7 nm, 8 nm, 9 nm, 10 nm, 11 nm, 12 nm, 13 nm, 14 nm, 15 nm, 16 nm, 17 nm, 18 nm, 19 nm, 20 nm, 30 nm, 40 nm, 50 nm, 60 nm, 70 nm, 80 nm, 90 nm, or 100 nm.

Meanwhile, a plurality of organic ligands 120 surrounding the surface of the halide perovskite nanocrystalline particles 110 may be further included.

The organic ligands may include an alkyl halide or carboxylic acid.

In addition, the alkyl halide surfactant may have a structure of alkyl-X. The halogen element corresponding to X at this time may include Cl, Br, or I. In addition, the alkyl structure at this time includes a structure such as acyclic alkyl having a structure of C$_n$H$_{2n+1}$, a primary alcohol having a structure such as C$_n$H$_{2n+1}$OH, a secondary alcohol, and a tertiary alcohol, alkylamine having a structure of alkyl-N (ex. Hexadecyl amine, 9-Octadecenylamine 1-Amino-9-octadecene (C$_{19}$H$_{37}$N)), p-substituted aniline and phenyl ammonium ammonium) and fluorine ammonium, but are not limited thereto.

The carboxylic acid may include 4,4'-Azobis(4-cyanovaleric acid), acetic acid, 5-aminosalicylic acid, acrylic acid, L-Aspentic acid, 6-Bromohexanoic acid, bromoacetic acid, dichloroacetic acid, ethylenediaminetetraacetic acid, isobutyric acid, itaconic acid, maleic acid, r-Maleimidobutylic acid, L-Malic acid, 4-Nitrobenzoic acid, 1-Pyronecarboxylic acid or oleic acid.

In addition, the halide perovskite nanocrystalline particles according to the present invention may provide nanocrystalline particles having various band gaps according to the substitution of organic elements.

For example, when (C$_n$H$_{2n+1}$NH$_3$)$_2$PbBr$_4$ has n value of 4, nanocrystalline particles having a band gap of about 3.5 eV may be provided. In addition, when n is 5, nanocrystalline particles having a band gap of about 3.33 eV may be provided. In addition, when n is 7, nanocrystalline particles having a band gap of about 3.34 eV may be provided. In addition, when n is 12, nanocrystalline particles having a band gap of about 3.52 eV may be provided.

In addition, the metal halide perovskite nanocrystalline particles according to the present invention may provide nanocrystalline particles having various band gaps according to the substitution of a central metal.

For example, the nanocrystalline particle including a CH$_3$NH$_3$PbI$_3$ organic-inorganic metal halide perovskite nanocrystal structure may have a band gap energy of about 1.5 eV. In addition, the nanocrystalline particle including the CH$_3$NH$_3$Sn$_{0.3}$Pb$_{0.7}$I$_3$ organic-inorganic metal halide perovskite nanocrystal structure may have a band gap energy of about 1.31 eV. In addition, the nanocrystalline particle including the CH$_3$NH$_3$Sn$_{0.5}$Pb$_{0.5}$I$_3$ organic-inorganic metal halide perovskite nanocrystal structure may have a band gap energy of about 1.28 eV. In addition, the nanocrystalline particle including the CH$_3$NH$_3$Sn$_{0.7}$Pb$_{0.3}$I$_3$ organic-inorganic metal halide perovskite nanocrystal structure may have a band gap energy of about 1.23 eV. In addition, the nanocrystalline particle including the CH$_3$NH$_3$Sn$_{0.9}$Pb$_{0.1}$I$_3$ organic-inorganic metal halide perovskite nanocrystal structure may have a band gap energy of about 1.18 eV. In addition, the nanocrystalline particle including the CH$_3$NH$_3$SnI$_3$ organic-inorganic metal halide perovskite nanocrystal structure may have a band gap energy of about 1.1 eV. In addition, the nanocrystalline particle including the CH$_3$NH$_3$Pb$_x$Sn$_{1-x}$Br$_3$ organic-inorganic metal halide perovskite nanocrystal structure may have a band gap energy of 1.9 eV to 2.3 eV. In addition, the nanocrystalline particle including the CH$_3$NH$_3$Pb$_x$Sn$_{1-x}$Cl$_3$ organic-inorganic metal halide perovskite nanocrystal structure may have a band gap energy of 2.7 eV to 3.1 eV.

Figure 5:
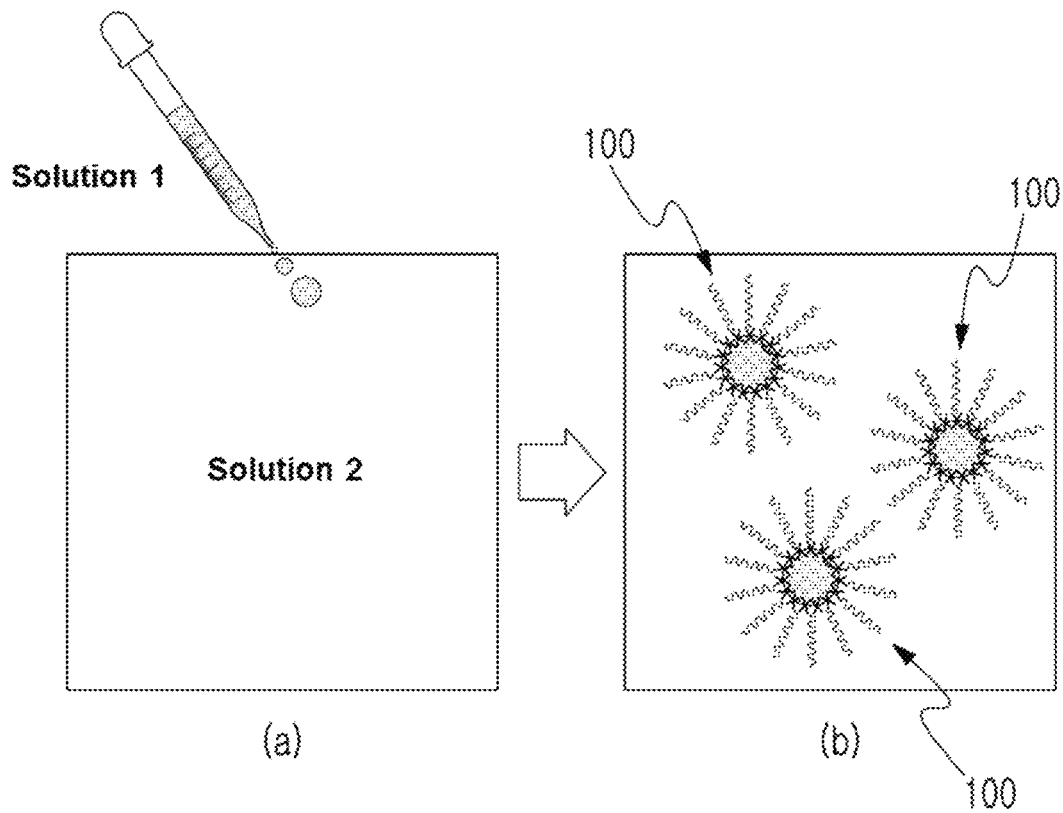
FIG. 5 is a schematic diagram showing a method of manufacturing the metal halide perovskite nanocrystalline particle light emitters constituting the perovskite thin film in the perovskite light-emitting device according to the present invention.

FIG. 5 is a schematic diagram illustrating a method of preparing halide perovskite nanocrystalline particles according to the present invention.

Referring to FIG. 5(a), a first solution in which halide perovskite is dissolved in a polar solvent and a second solution in which a surfactant is dissolved in a non-polar solvent are prepared.

The polar solvent may include dimethylformamide, gamma butyrolactone, N-methylpyrrolidone, or dimethylsulfoxide, but is not limited thereto.

The halide perovskite may be a material having a three-dimensional crystal structure, a two-dimensional crystal structure, a one-dimensional crystal structure, or a zero-dimensional crystal structure.

For example, the halide perovskite having a three-dimensional crystal structure may have an ABX$_3$ structure. In addition, halide perovskite having a two-dimensional crystal structure may have a structure of A$_2$BX$_4$, ABX$_4$, or A$_{n-1}$Pb$_n$X$_{3n+1}$ (n is an integer between 2 and 6) or may include such a structure. In addition, the halide perovskite having a one-dimensional crystal structure may have an $A_3BX_5$ structure. In addition, the halide perovskite having a zero-dimensional crystal structure may have an $A_4BX_6$ structure.

On the other hand, such a metal halide perovskite can be prepared by combining AX and $BX_2$ in a certain ratio. That is, the first solution may be formed by dissolving AX and $BX_2$ in a polar solvent at a predetermined ratio. For example, by dissolving AX and $BX_2$ in a polar solvent in a ratio of 2:1, a first solution in which a metal halide perovskite precursor is dissolved may be prepared.

In addition, the non-polar solvent at this time may include dichloroethylene, trichloroethylene, chloroform, chlorobenzene, dichlorobenzene, styrene, dimethylformamide, dimethylsulfoxide, xylene, toluene, hexane, octadecene, cyclohexene or isopropyl alcohol, but is not limited thereto.

In addition, the surfactant may include an alkyl halide, an alkylamine, and a carboxylic acid or phosphonic acid. The alkyl halide or carboxylic acid types are the same as described above.

Next, the first solution is mixed with the second solution to form nanocrystalline particle.

In the step of forming nanocrystalline particle by mixing the first solution with the second solution, it is preferable to mix the first solution by dropping the first solution into the second solution. For example, nanocrystalline particles may be synthesized by slowly adding the first solution, in which the precursors of halide perovskites are dissolved, dropwise to the second solution in which the alkyl halide surfactant is dissolved and while being vigorously stirred.

In this case, when the first solution is dropped into the second solution and mixed, organic-inorganic halide perovskite is precipitated from the second solution due to a difference in solubility. The halide perovskite precipitated in the second solution is stabilized by an alkyl halide surfactant to form well-dispersed halide perovskite nanocrystals. Accordingly, it is possible to prepare halide perovskite nanocrystalline particles including halide perovskite nanocrystals and a plurality of alkyl halide organic ligands surrounding the halide perovskite nanocrystals. Therefore, it is possible to manufacture halide perovskite nanocrystalline particles comprising a halide perovskite nanocrystal and a plurality of alkyl halide organic ligands surrounding the halide perovskite nanocrystals.

Meanwhile, the size of the crystalline particles of the organic/inorganic metal halide perovskite can be controlled by controlling the length or shape factor and amount of the alkyl halide surfactant. For example, the shape factor control can control the size through a linear, tapered, or inverted triangular surfactant.

In addition, the halide perovskite nanocrystalline particles according to an embodiment of the present invention may have a core-shell structure.

Hereinafter, a core-shell structured halide perovskite nanocrystalline particle according to an embodiment of the present invention will be described.

Figure 6:
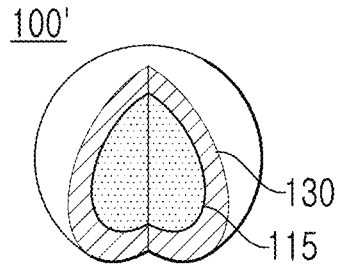
FIG. 6 is a schematic diagram showing metal halide perovskite nanocrystalline particles having a core-shell structure constituting the perovskite thin film and an energy band diagram thereof in the perovskite light-emitting device according to the present invention.
Figure 6:
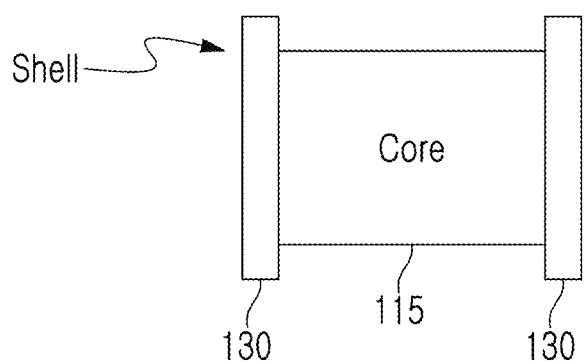

FIG. 6 is a schematic diagram showing halide perovskite nanocrystalline particles having a core-shell structure and an energy band diagram thereof according to the present invention.

Referring to FIG. 6(a), a core-shell structured halide perovskite nanocrystalline particle 100 according to the present invention includes a core 115 and a shell 130 surrounding the core 115. In this case, a material having a band gap larger than that of the core 115 may be used as the material of the shell 130.

At this time, referring to FIG. 6(b), the energy band gap of the shell 130 is larger than the energy band gap of the core 115, so that excitons can be better confined to the core halide perovskite.

Figure 7:
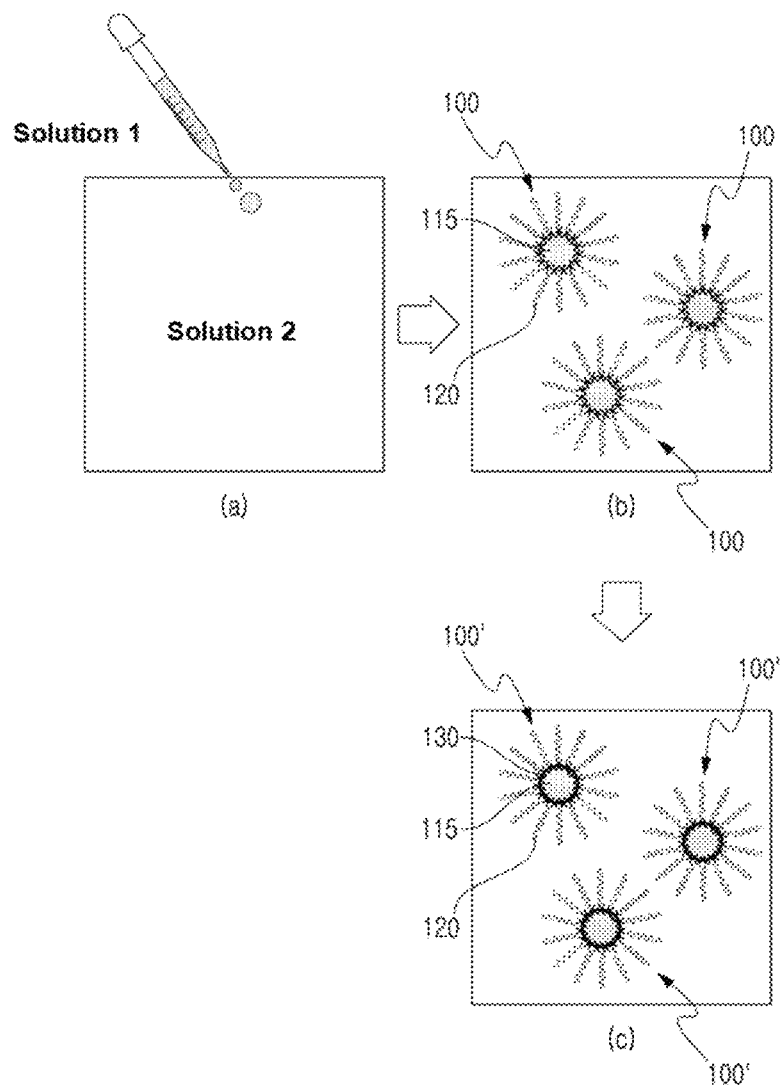
FIG. 7 is a schematic diagram illustrating a method of manufacturing the metal halide perovskite nanocrystalline particles having a core-shell structure constituting the perovskite thin film in the perovskite light-emitting device according to the present invention.

FIG. 7 is a schematic diagram showing a method for preparing a halide perovskite nanocrystalline particle having a core-shell structure according to the present invention.

Referring to FIG. 7(a), a first solution in which a first halide perovskite is dissolved in a polar solvent is added dropwise to a second solution in which an alkyl halide surfactant is dissolved in a non-polar solvent.

Referring to FIG. 7(b), when a first solution is added to the second solution, the first halide perovskite is precipitated in the second solution due to the solubility difference, and the first halide perovskite is surrounded by the alkyl halide surfactant to stabilize the surface and includes the first halide perovskite nanocrystalline core 115. In this case, the nanocrystalline core 115 is surrounded by the alkyl halide organic ligands 120.

Referring to FIG. 7(c), halide perovskite nanocrystalline particles 100 having a core-shell structure can be prepared by forming a shell 130 including a material having a larger band gap than the core 115 while surrounding the core 115.

The following five methods can be used for the methods of forming such a shell.

As a first method, a shell may be formed using a second halide perovskite solution or an inorganic semiconductor material solution. That is, by adding a third solution, in which a second halide perovskite having a larger band gap than the first halide perovskite or an inorganic semiconductor material is dissolved, to the second solution, a shell may be formed: The shell surrounding the core may include a second perovskite nanocrystal, an inorganic semiconductor material or an organic polymer.

For example, while strongly stirring the solution of halide perovskites ($MAPbBr_3$) produced through the inverse nano-emulsion method, ligand-assisted reprecipitation method, and hot injection method as described above, a solution of halide perovskite ($MAPbCl_3$) with a larger band gap than $MAPbBr_3$, or a solution of inorganic semiconductor materials such as metal sulfide (e.g. PbS and ZnS) or metal oxide or a precursor solution thereof, or a solution of organic polymers such as polyethylene glycol, polyethylene oxide, polyvinylpyrrolidone, polyethyleneimine, polyvinyl alcohol (PVA), polysilazane, acrylate polymer, fluorinated polyvinylidene fluoride (PVDF) polymer, and acrylate-based low-molecular monomer, are slowly added dropwise or several drops into the metal halide perovskite solution. Then, a shell that includes a second halide perovskite nanocrystal ($MAPbCl_3$) or an inorganic semiconductor material may be formed. MA above stands for methyl ammonium.

The core-shell halide perovskite nanocrystals are synthesized because the core made of halide perovskite and the shell made of halide perovskite are mixed to form an alloy or adhere to each other.

Therefore, it is possible to form halide perovskite nanocrystalline particles of $MAPbBr_3/MAPbCl_3$ core-shell structure.

As a second method, a shell can be formed using an organic ammonium halide solution. That is, after adding a large amount of the organic ammonium halide solution to the second solution and stirring, a shell having a larger band gap than the core surrounding the core may be formed.

For example, by adding a MACl solution to a halide perovskite ($MAPbBr_3$) solution produced through the inverse nano-emulsion method as described above while being vigorously stirred, $MAPbBr_3$ on the surface is converted to $MAPbBr_{3-x}Cl_x$ by an excessive amount of MACl to form a shell.

Accordingly, halide perovskite nanocrystalline particles having a $MAPbBr_3/MAPbBr_{3-x}Cl_x$ core-shell structure can be formed.

As a third method, the shell can be formed using a pyrolysis/synthesis method. That is, after thermally decomposing the surface of the core by heat-treating the second solution, an organic ammonium halide solution is added to the heat-treated second solution to synthesize the surface again, so that the shell which has larger band gap than that of the core is formed while the shell surrounds the core.

For example, the halide perovskite ($MAPbBr_3$) solution produced through the inverse nano-emulsion method may be thermally decomposed to convert the surface to $PbBr_2$, and then the MACl solution may be added to synthesize the surface to $MAPbBr_2Cl$ to form a shell. Accordingly, halide perovskite nanocrystalline particles having a $MAPbBr_3/MAPbBr_2Cl$ core-shell structure can be formed.

Therefore, the halide perovskite nanocrystalline particles of the core-shell structure formed according to the present invention form a shell with a material having a larger band gap than the core, so that excitons are better confined to the core, and the halide perovskite nanocrystalline particles are stable in air. It is possible to improve the durability of nanocrystals by using air-stable perovskite or inorganic semiconductor to prevent the core made of perovskite from being exposed to air.

As a fourth method, a shell can be formed using an organic semiconductor material solution. That is, in the second solution, an organic semiconductor material having a larger band gap than the halide perovskite is previously dissolved, and the first solution in which the above-described first halide perovskite is dissolved is added to the second solution. A core including a first halide perovskite nanocrystal and a shell including an organic semiconductor material surrounding the core may be formed.

Since the organic semiconductor material adheres to the surface of the core halide perovskite, it is possible to synthesize a halide perovskite having a core-shell structure.

Therefore, $MAPbBr_3$-organic semiconductor core-shell structure halide perovskite nanocrystalline particle light emitters can be formed.

As a fifth method, a shell may be formed using a selective extraction method. That is, by adding a small amount of IPA solvent to the second solution in which the core containing the first halide perovskite nanocrystal is formed, MABr is selectively extracted from the surface of the nanocrystal and the surface is formed only with $PbBr_2$. Therefore, shell which surrounds the core and has a larger band gap than the core may be formed.

For example, by adding a small amount of IPA to the halide perovskite ($MAPbBr_3$) solution produced through the inverse nano-emulsion method as described above, only MABr on the nanocrystal surface is selectively dissolved and extracted so that only $PbBr_2$ remains on the surface and forms $PbBr_2$ shell.

That is, at this time, MABr on the surface of $MAPbBr_3$ may be removed through selective extraction.

Therefore, it is possible to form a halide perovskite nanocrystalline particle light emitter having a $MAPbBr_3$—$PbBr_2$ core-shell structure.

Figure 8:
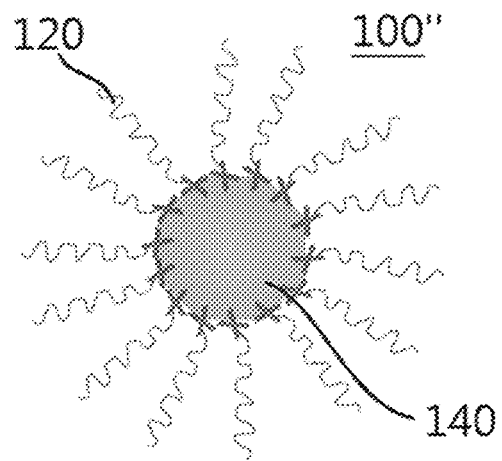
FIG. 8 is a schematic diagram showing the metal halide perovskite nanocrystalline particles having a gradient composition structure constituting the perovskite thin film in the perovskite light-emitting device according to the present invention.

FIG. 8 is a schematic diagram showing a halide perovskite nanocrystalline particle having a gradient composition structure according to the present invention.

Referring to FIG. 8, a halide perovskite nanocrystalline particle 100" having a structure having a gradient composition according to an embodiment of the present invention has a halide perovskite nanocrystal structure 140 that can be dispersed in an organic solvent and the nanocrystal structure 140 has a gradient composition structure whose composition changes from the center toward the outside. the organic solvent at this time may be a polar solvent or a non-polar solvent.

The halide perovskite at this time has a structure of $ABX_{3-m}X'_m$, $A_2BX_{4-l}X'_l$ or $ABX_{4-k}X'_k$, wherein A is a monovalent cation, B is a metal material, and X is Br, X' may be Cl or X may be I, and X' may be Br. In addition, the m, l, and k values are characterized by increasing from the center of the nanocrystal structure 140 toward the outside. Types of A, B, and X in halide perovskites are as described above.

According to the gradient composition, the energy band gap increases from the center of the nanocrystal structure 140 toward the outside.

Meanwhile, the m, l, and k values may gradually increase from the center of the nanocrystal structure toward the outside. Therefore, the energy band gap may gradually increase according to the composition change.

As another example, the m, l, and k values may increase in a stepwise shape from the center of the nanocrystal structure toward the outside. Therefore, according to the composition change, the energy band gap may increase in the form of a step.

In addition, a plurality of organic ligands 120 surrounding the metal halide perovskite nanocrystal structure 140 may be further included. The organic ligand 120 may include an alkyl halide, an alkylamine, and a carboxylic acid or phosphonic acid. Available examples of alkyl halides are as described above.

Therefore, by making the nanocrystal structure into a gradient-alloy type, the contents of the metal halide perovskite present in a large amount outside the nanocrystal structure and the metal halide perovskite present in a large amount inside the nanocrystal structure can be gradually changed. This gradual change in the content in the nanocrystal structure uniformly adjusts the fraction in the nanocrystal structure, reduces surface oxidation, and improves exciton confinement in the metal halide perovskite present in a large amount, thereby increasing luminescence efficiency, and not only that, it can also increase durability-stability.

The method for preparing metal halide perovskite nanocrystalline particles having a gradient composition structure includes preparing a halide perovskite nanocrystalline particle having a core-shell structure, and forming the halide perovskite nanocrystalline particles to have a gradient composition through interdiffusion by heat treatment.

First, a core-shell structure of halide perovskite nanocrystalline particles is prepared. A method of manufacturing a metal halide perovskite nanocrystalline particle having a related core-shell structure is the same as described above with reference to FIG. 7, and a detailed description thereof is omitted.

Thereafter, the core-shell structured metal halide perovskite nanocrystalline particles may be heat-treated to form a gradient composition through interdiffusion.

For example, a halide perovskite having a core-shell structure is annealed at a high temperature to form a solid solution, and then gradient composition is formed through interdiffusion by heat treatment.

For example, the heat treatment temperature may be 100° C. to 150° C. Interdiffusion can be induced by annealing at this heat treatment temperature.

In addition, the perovskite nanocrystalline particles with a gradient composition may be formed by forming a first halide perovskite nanocrystalline core and then forming a second halide perovskite nanocrystalline shell with a gradient composition surrounding the core.

First, a first halide perovskite nanocrystalline core is formed. This is the same as the method of forming the nanocrystalline core described above, so a detailed description thereof will be omitted.

Then, a second metal halide perovskite nanocrystalline shell having a gradient composition, surrounding the core, is formed.

The second halide perovskite has a structure of $ABX_{3-m}X'_m$, $A_2BX_{4-l}X'_l$ or $ABX_{4-k}X'_k$, wherein A is an amidinium-based organic material or organic ammonium material, and B may be a metal material, X may be Br, and X' may be Cl.

Accordingly, a third solution in which second halide perovskite is dissolved may be added to the second solution while increasing the m, l, or k value.

That is, a solution in which the composition of $ABX_{3-m}X'_m$, $A_2BX_{4-l}X'_l$ or $ABX_{4-k}X'_k$ is controlled may be continuously dropped to form a shell having a continuously changed composition.

Figure 9:
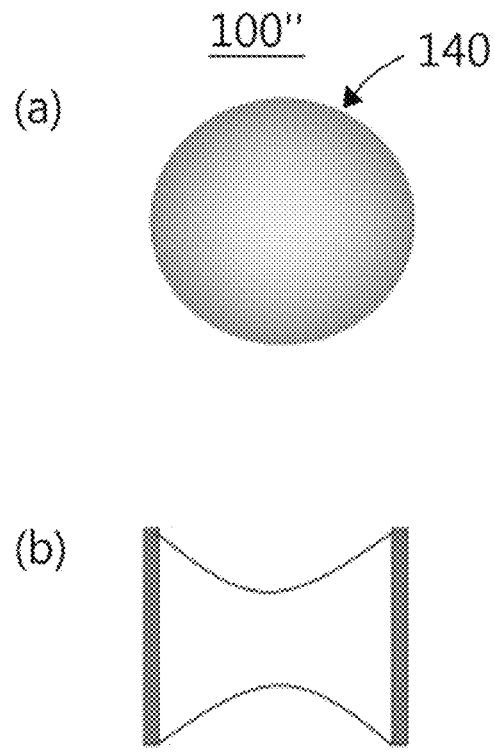
FIG. 9 is a schematic diagram showing the metal halide perovskite nanocrystalline particles having a gradient composition structure constituting the perovskite thin film and an energy band diagram thereof in the perovskite light-emitting device according to the present invention.

FIG. 9 is a schematic diagram showing a halide perovskite nanocrystalline particle having a structure having a gradient composition and an energy band diagram thereof according to an embodiment of the present invention.

Referring to FIG. 9(a), it can be seen that the nanocrystalline particle 100" according to the present invention is a halide perovskite nanocrystal structure 140 having a gradient composition of varying content. In this case, FIG. 9(b), by changing the composition of the material from the center of the halide perovskite nanocrystal structure 140 toward the outside, the energy band gap may be increased from the center to the outside.

Meanwhile, the halide perovskite nanocrystalline particles according to the present invention may be nanocrystalline particle of doped halide perovskites.

The doped halide perovskite contains a structure of $ABX_3$, $A_2BX_4$, $ABX_4$ or $A_{n-1}B_nX_{3n+1}$ (n is an integer between 2 and 6), and a part of A is substituted with A', or a part of B is substituted with B', or a part of X is substituted with X', wherein A and A' are amidinium-based organic materials, organic ammonium materials or alkali metals and B and B' are metal materials, and the X and X' may be halogen elements.

The types of the amidinium-based organic material and the organic ammonium material are as described above.

In addition, it is desirable that a ratio in which a part of A is substituted with A', a part of B is substituted with B', or a part of X is substituted with X' is 0.1% to 5%.

In addition, it is desirable that a ratio in which a part of A is substituted with A', a part of B is substituted with B', or a part of X is substituted with X' is 0.1% to 5%.

Figure 10:
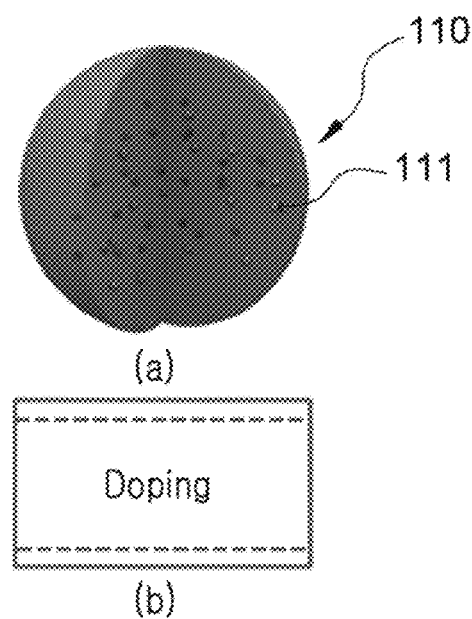
FIG. 10 is a schematic diagram showing doped perovskite nanocrystalline particles constituting the perovskite thin film and an energy band diagram thereof in the perovskite light-emitting device according to the present invention.

FIG. 10 is a schematic diagram showing a doped halide perovskite nanocrystalline particle and an energy band diagram thereof according to the present invention.

FIG. 10(a) is a partially cut-away schematic diagram of a halide perovskite nanocrystal structure 110 doped with a doping element 111. FIG. 10(b) is a band diagram of such a doped metal halide perovskite nanocrystal structure 110.

Referring to FIGS. 10(a) and 10(b), a semiconductor type may be changed to an n-type or a p-type through doping with a halide perovskite. For example, when a halide perovskite nanocrystal of $MAPbI_3$ is partially doped with Cl, it can be changed to n-type to control electro-optical properties. MA at this time is methyl ammonium.

Figure 11:
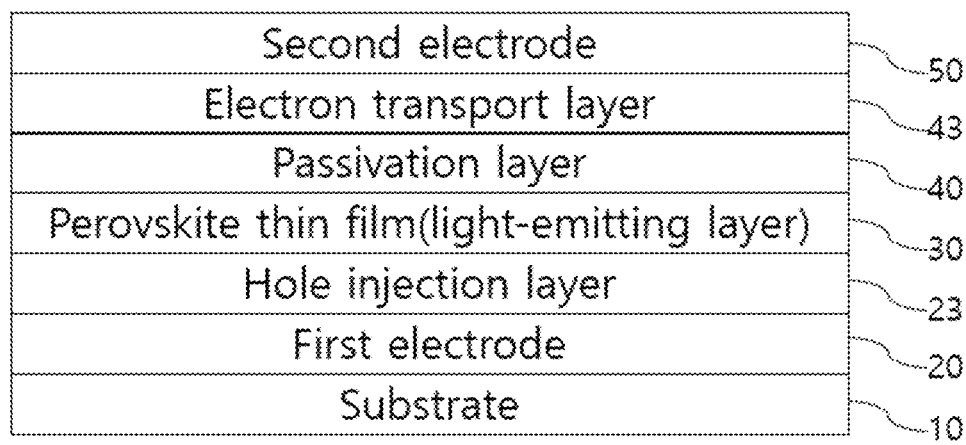
FIG. 11 is a schematic diagram showing a method of manufacturing the perovskite light-emitting device according to the present invention.

FIG. 11 is a cross-sectional view illustrating a method of manufacturing a perovskite light-emitting device according to the present invention.

Referring to FIG. 11, an organic solution including metal halide perovskite nanocrystalline particles dispersed in an organic solvent is prepared.

The organic solvent may include a polar solvent or a non-polar solvent, and the polar solvent may include dimethylformamide, gamma butyrolactone, N-methylpyrrolidone, or dimethylsulfoxide, and the non-polar solvent may include dichloroethylene, trichloroethylene, chloroform, chlorobenzene, dichlorobenzene, styrene, dimethylformamide, dimethylsulfoxide, xylene, toluene, cyclohexene, or isopropyl alcohol.

Preparing the organic solution may include a step of preparing a first solution in which metal halide perovskite is dissolved in a polar solvent and a second solution in which a surfactant is dissolved in a non-polar solvent, a step of mixing the first solution with the second solution to form metal halide perovskite nanocrystalline particles. In this regard, as described above, a detailed description thereof will be omitted.

Next, the organic solution is applied onto the first electrode 20 to form a perovskite thin film 30. In the stage of forming the perovskite thin film 30, it is characterized in that it is performed and applied through spin-coating, bar-coating, spray coating, slot-die coating, gravure coating, blade-coating, screen printing, nozzle printing, inkjet printing, electrohydrodynamic-jet printing, electrospray or electrospinning.

Accordingly, when the thin film is formed through the printing method, the perovskite nanocrystalline particles form the thin film in a crystallized state, and thus the coating speed, the coating environment, and the crystallinity of substrate layer (lower part) are not affected as compared to the bulk perovskite thin film crystallized during coating.

Figure 24:
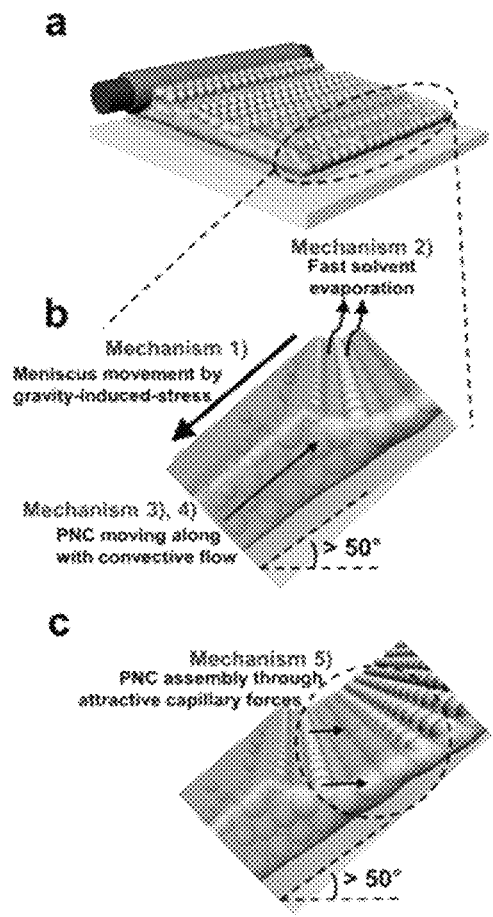
FIG. 24 is a schematic diagram illustrating a bar coating applied for forming a perovskite light-emitting layer according to Production Example 4 of the present invention.

Referring to FIG. 24, the bar coating includes a step of applying a perovskite nanocrystalline particle solution onto the first electrode; a step of tilting the first electrode, on which the perovskite nanocrystalline particle solution is applied, and a step of performing bar coating of the perovskite nanocrystalline particle solution on the inclined first electrode. The applying of the solution is performed by dropping the solution.

In this case, the step of imparting the inclination angle is performed by tilting the applied substrate or the like at a predetermined angle based on the horizontal plane or the ground. An inclination angle, which is an angle inclined relative to the horizontal plane, is appropriate to be 30° to 70°. When the inclination angle of the substrate is large, the solution is biased to the ground by gravity, and a thin film having a desired thickness cannot be formed. In addition, when the inclination angle of the substrate is less than 30°, the flow of the solvent and the evaporation effect are not sufficiently obtained. Hereinafter, a process of forming a thin film by an inclination angle is performed. In this case, the inclination angles may be preferably 30°, 35°, 40°, 41°, 42°, 43°, 44°, 45°, 46°, 47°, 48°, 49°, 50°, 55°, 60°, 65°, or 70°.

As described above, in the region where the coating is performed by applying an inclination angle, the perovskite nanocrystalline particles (PNC) are aligned by capillary forces acting on each other. In addition, a certain slope is formed in the region where bar coating is carried out, and the solvent is quickly evaporated on the slope side, and the solution is pushed out by meniscus movement in accordance with gravity, and perovskite nanocrystalline particles are aligned under the bar due to convective flow.

Typically, spin coating is generally used to form a perovskite thin film, but bar coating is required to manufacture a large-area device.

However, when the thin film is manufactured using such a printing method, the evaporation rate of the solvent is slow, and thus larger crystals (>μm) may be formed through recrystallization of the nanocrystalline particles through aggregation or agglomeration.

Therefore, immediately thereafter, the formed nanocrystalline particle thin film is dried. Preferably, it can be dried through air blowing. Therefore, in the present invention, after the organic solution is applied on a substrate, a drying step is further performed to prevent recrystallization between the nanocrystalline particles.

For example, by directly drying the thin film formed through bar coating or the like through air blowing, recrystallization between nanocrystalline particles may be prevented.

In addition, an organic ligand removal process is added to the perovskite thin film 30. That is, the organic ligand in the solution that is not bound to the perovskite nanocrystalline particles in the applied organic solution is removed.

Next, a passivation layer 40 is formed on the perovskite thin film 30.

The perovskite thin film 30 shows relatively low luminescence efficiency due to surface defects still present, and causes charge carrier imbalance in the light-emitting device, thereby showing low luminescence efficiency. Accordingly, it is necessary to eliminate defects in the perovskite thin film 30 and to resolve charge imbalance in the light-emitting device.

Accordingly, the present invention forms a passivation layer 40 on the perovskite thin film 30 in a light-emitting device including the perovskite thin film 30 as a light-emitting layer.

In the perovskite light-emitting device according to the present invention, the passivation layer 40 uses an organic material or a compound of the passivation material (1) or (2).

The compound of Formula 1 may stabilize defects in the light-emitting layer by supplementing the deficiency of halogen in the perovskite crystal.

The thickness of the passivation layer 40 is 1 nm to 10 nm, preferably, 2 nm to 5 nm. Specifically, it may be 1 nm, 2 nm, 3 nm, 4 nm, 5 nm, 6 nm, 7 nm, 8 nm, 9 nm, or 10 nm. If the thickness of the passivation layer exceeds 10 nm, there is a problem in that charge injection is lowered due to insulation characteristics.

The passivation layer 40 may be applied by performing spin coating, bar coating, spray coating, slot die coating, gravure coating, blade coating, screen printing, nozzle printing, inkjet printing, electrohydrodynamic jet printing, electrospraying, or electrospinning.

Figure 12:
FIG. 12 is a schematic diagram for explaining a mechanism in which defects in the perovskite thin film is healed by the passivation layer according to a preferred embodiment of the present invention.

FIG. 12 is a schematic diagram for explaining a mechanism by which defects in a perovskite thin film are healed by a passivation layer according to a preferred embodiment of the present invention.

Referring to FIG. 12, a 1,3,5-tris (bromomethyl)-2,4,6-triethylbenzene (TBTB) molecule forming a passivation layer is applied to defect sites of a perovskite thin film. To fill the defects in the crystal structure, Br derived from TBTB structure or debromination thereof replace bromine sites of the perovskite crystal structure from which the bromines are deviated. Through this, a passivation operation is performed. Subsequently, hydrogenation to which hydrogen is bound is performed in TBTB in which Br is provided to the perovskite thin film. All of the above reactions are thermodynamically preferred and have a value of ΔE less than 0.

A second electrode 50 may be formed on the passivation layer 40.

The second electrode 50 is a cathode into which electrons are injected, and may be made of a material having conductive properties. When the second electrode 50 is a cathode, it is preferably a metal, and for example, the second electrode 50 may be formed using a metal such as aluminum, magnesium, calcium, sodium, potassium, indium, yttrium, lithium, silver, lead, cesium, or a combination of two or more thereof.

Meanwhile, in an embodiment of the present invention, the first electrode 20 may be used as a cathode, and the second electrode 50 may be used as an anode.

The first electrode 20 or second electrode 50 can be formed by physical vapor deposition (PVD), chemical vapor deposition (CVD), sputtering, pulsed laser deposition (PLD), evaporation method, electron beam evaporation, atomic layer deposition (ALD) or molecular beam epitaxy vapor deposition (MBE).

On the other hand, in the light-emitting diodes according to the embodiment of the present invention, when the first electrode 20 is the anode, and the second electrode 50 is the cathode, as shown in FIG. 11, a hole injection layer 23 for facilitating hole injection and hole transport layer for facilitating transport may be provided between the first electrode 20 and the metal halide perovskite thin film (light-emitting layer) 30. Further, an electron transport layer 43 for facilitating electron transport and an electron injection layer for facilitating electron injection may be provided between the passivation layer 40 and the second electrode 50.

In addition, a hole blocking layer (not shown) can be placed between the metal halide perovskite thin film (light-emitting layer) 30 and the electron transport layer 43. Further, an electron blocking layer can be disposed between the halide perovskite thin film (light-emitting layer) 30 and the hole transport layer. However, the present invention is not limited thereto, and the electron transport layer 43 can perform the role of the hole blocking layer, or the hole transport layer can also perform the role of the electron blocking layer.

The hole injection layer 23 and/or the hole transport layer have a HOMO level between the work function level of the first electrode (anode) 20 and the HOMO level of the metal halide perovskite thin film (light-emitting layer) 30, and functions to improve the injection or transport efficiency of holes into the metal halide perovskite thin film (light-emitting layer) 30 from the first electrode (anode) 20.

The hole injecting layer 23 or the hole transporting layer can include materials commonly used as hole transporting materials, and one layer can comprise different hole transporting material layers. The hole transport material is, for example, mCP (N, Ndicarbazolyl-3,5-benzene); PEDOT:PSS (poly(3,4-ethylenedioxythiophene): polystyrenesulfonate); NPD (N,N'-di(1-naphthyl))-N,N'-diphenylbenzidine); N,N'-diphenyl-N,N'-di (3-methylphenyl)-4,4'-diaminobiphenyl (TPD); DNTPD (N4,N4'-Bis [4-[bis (3-methylphenyl) amino] phenyl]-N4,N4'-diphenyl-[1,1'-biphenyl]-4,4'-diamine); N,N'-diphenyl-N,N'-Dinaphthyl-4, 4'-diaminobiphenyl; N,N,N'N'-tetra-p-tolyl-4,4'-diaminobiphenyl; N,N,N'N'-tetraphenyl-4,4'-Diaminobiphenyl; derivatives of porphyrin compounds such as copper (II) 1,10,15,20-tetraphenyl-21H, 23H-popyrin; TAPC (1,1-Bis [4-[N,N'-Di) (P-tolyl) Amino] Phenyl] Cyclohexane); Triallylamine derivatives such as N,N,N-tri (p-tolyl) amine and 4,4',4'-tris [N-(3-methylphenyl)-N-phenylamino]triphenylamine; carbazole derivatives such as N-phenylcarbazole and polyvinylcarbazole; phthalocyanine derivatives such as metal-free phthalocyanine and copper phthalocyanine; starburstamine derivatives; enamine stilbene derivatives; derivatives of tertiary aromatic amine and styrylamine compounds; polysilanes or the like. These hole transporting materials can also perform the role of an electron blocking layer.

The hole blocking layer serves to prevent triplet excitons or holes from diffusing in the direction of the second electrode (cathode) 50 and can be selected randomly among the known hole blocking material. For example, an oxadiazole derivative, a triazole derivative, a phenanthroline derivative, TSPO1 (diphenylphosphine oxide-4-(triphenylsilyl) phenyl) or the like can be used.

The electron injecting layer and/or the electron transporting layer 43 have a LUMO level between the work function level of the second electrode (cathode) 50 and the LUMO level of the metal halide perovskite thin film (light-emitting layer) 30, and functions to increase the efficiency of electron injection or transport into the metal halide perovskite thin film (light-emitting layer) 30 from the second electrode (cathode) 50.

The electron injection layer can be, for example, LiF, NaCl, CsF, $Li_2O$, BaO, $BaF_2$, or Liq (lithium quinolate).

The electron transport layer 43 includes TSPO1 (diphenylphosphine oxide-4-(triphenylsilyl) phenyl), TPBi (1,3,5-tris (N-phenylbenzimidazol-2-yl) benzene), Tris(8-hydroxyquinoline)aluminum (Alq3), 2,5-diarylsilrol derivative (PyPySPyPy), Perfluorinated compound (PF-6P), COTs (Octasubstituted cyclooctatetraene), TAZ (see chemical formula below), Bphen(4,7-diphenyl-1,10-phenanthroline(4,7-diphenyl-1,10-phenanthroline), BCP (see chemical formula below), or BAlq (see chemical formula below).

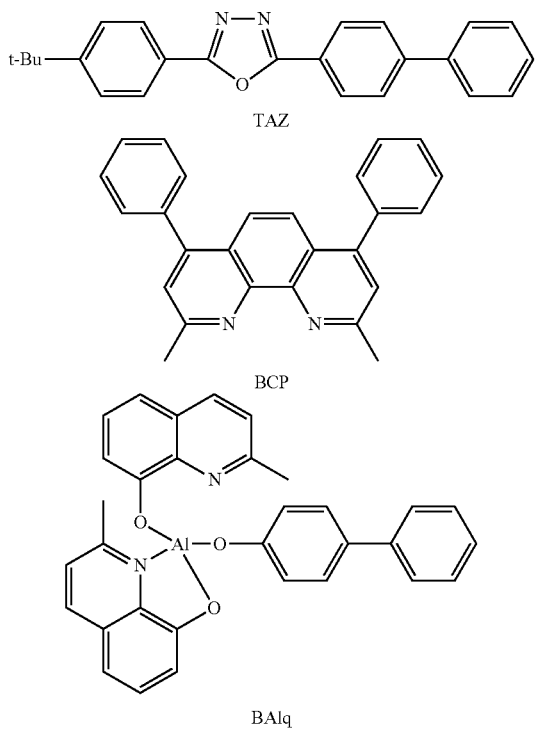

TAZ

BCP

BAlq

In the perovskite light-emitting device according to the present invention, the passivation layer 40, instead of forming between the perovskite thin film 30 and the second electrode 50 as in FIG. 1, it may be formed between the first electrode 20 and the perovskite thin film 30 using the organic material or compound of the passivation material 1 or 2, and for more complete passivation, it may be simultaneously formed between the perovskite thin film 30 and the second electrode 50 and between the first electrode 20 and the perovskite thin film 30.

Hereinafter, preferred production examples and measurement examples are presented to aid in understanding of the present invention.

Production Example 1-1

Synthesis of Halide Perovskite Nanocrystalline Particles

Halide perovskite nanocrystalline particles having a three-dimensional structure are formed through the Ligand-assisted recrystallization (LARP) method. Specifically, a first solution is prepared by dissolving halide perovskite in a polar solvent. Dimethylformamide is used as a polar solvent at this time, and $FAGAPbBr_3$ (FA is formamidinium, GA is guanidium) is used as halide perovskite. $FAGAPbBr_3$ used at this time is a mixture of FABr, GABr, and $PbBr_2$ in a molar ratio of 9:1:5.

And, a second solution in which an alkyl halide surfactant is dissolved in a non-polar solvent is prepared. At this time, toluene is used as a non-polar solvent, and decylamine ($C_{10}H_{23}N$) and oleic acid ($C_{18}H_{34}O_2$) are used as surfactants.

Then, 150 µl of the first solution is injected into the second solution that is being strongly stirred to form halide perovskite nanocrystalline particles having a three-dimensional structure.

Next, halide perovskite nanocrystalline particles in a solution state are coated on a glass substrate to form a halide perovskite nanocrystalline particle thin film. The size of the halide perovskite nanocrystalline particles formed at this time is about 10 nm.

Particularly, the composition formula of nanocrystal particles excluding the surfactant acting as an organic ligand in the halide perovskite nanocrystalline particles is $FA_{0.9}GA_{0.1}PbBr_3$.

Production Example 1-2

Manufacture of a Perovskite Light-Emitting Device Including a Passivation Layer

After preparing an ITO substrate (a glass substrate coated with an ITO anode), a solution obtained by mixing a conductive material PEDOT:PSS (AI4083, Heraeus) and a perfluorinated ionomer (PFI, Nafion resin 5 wt %, Sigma-Aldrich) at a weight ratio of 1:1.5 is spin-coated on the ITO anode, and then thermal-treated at 150° C. for 30 minutes to form a hole injection layer with a thickness of 50 nm.

150 µL of a solution in which halide perovskite nanocrystalline particles are dispersed according to Production Example 1-1 are dropped on the PEDOT:PSS/PFI thin film, held for 10 minutes, and then spin coated and thermally treated at 90° C. for 10 minutes to form a halide perovskite nanocrystalline particle light-emitting layer.

Next, 1,3,5-tris (bromomethyl)-2,4,6-triethylbenzene (TBTB) of Formula 5-1 is dissolved in a non-polar solvent to prepare a solution for a passivation layer. In this case, toluene is used as the non-polar solvent, and the solution is prepared at a concentration of 1 mg/mL.

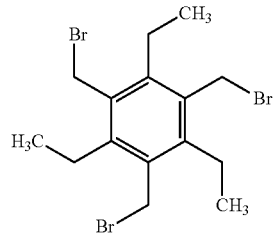

Formula 5-1

Next, the solution for the passivation layer is spin-coated on the light-emitting layer having halide perovskite nanocrystalline particles and heat-treated at 90° C. for 10 minutes to form a passivation layer with a thickness of 5 nm.

Thereafter, 1,3,5-tris(1-phenyl-1H-benzimidazole-2-il) benzene (TPBI) with a thickness of 50 nm is deposited in a high vacuum of $1\times10^{-7}$ Torr or less to form an electron transport layer, and LiF with a thickness of 1 nm is deposited to form an electron injection layer and thereon aluminum with a thickness of 100 nm is deposited to form a cathode, through this procedure perovskite light-emitting device is fabricated.

In addition, those skilled in the art may use an appropriate material as a passivation layer in consideration of the composition of the light-emitting layer. That is, F, Cl, or I may be selectively applied by replacing Br in TBTB to suit the emission color and perovskite composition. That is, the passivation layer that may be used in the present production example is according to Formula 5 below.

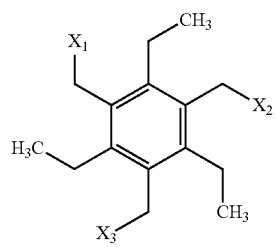

Formula 5

In Formula 5, $X_1$, $X_2$ or $X_3$ is F, Cl, Br or I.

Production Example 1-3

Manufacture of a Perovskite Light-Emitting Device Including a Passivation Layer

A perovskite light-emitting device is prepared in the same manner as in Production Example 1-2, and a compound represented by Formula 1-1 is used instead of the compound of Formula 5-1.

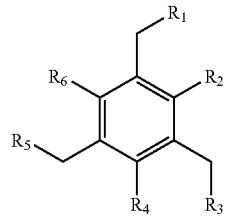

Formula 1-1

In Formula 1-1, $R_1$, $R_3$ and $R_5$ are $C_2H_5$, and $R_2$, $R_4$ and $R_6$ are $CH_2Br$.

Production Example 1-4

Manufacture of a Perovskite Light-Emitting Device Including a Passivation Layer

A perovskite light-emitting device is prepared in the same manner as in Production Example 1-2, and a compound represented by Formula 1-2 is used instead of the compound of Formula 5-1.

Formula 1-2

In Formula 1-2, $R_1$, $R_3$ and $R_5$ are $C_3H_7$, and $R_2$, $R_4$ and $R_6$ are $CH_2Br$.

Production Example 1-5

Manufacture of a Perovskite Light-Emitting Device Including a Passivation Layer

A perovskite light-emitting device is prepared in the same manner as in Production Example 1-2, and a compound represented by Formula 1-3 is used instead of the compound of Formula 5-1.

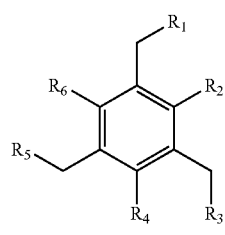

Formula 1-3

In Formula 1-3, $R_1$, $R_3$ and $R_5$ are $C_4H_9$, and $R_2$, $R_4$ and $R_6$ are $CH_2Br$.

Production Example 1-6

Manufacture of a Perovskite Light-Emitting Device Including a Passivation Layer

A perovskite light-emitting device is prepared in the same manner as in Production Example 1-2, and a compound represented by Formula 1-4 is used instead of the compound of Formula 5-1.

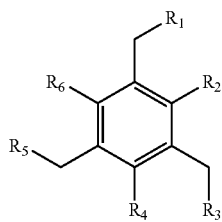

Formula 1-4

In Formula 1-4, $R_1$, $R_3$ and $R_5$ are phenyl groups, and $R_2$, $R_4$ and $R_6$ are $CH_2Br$.

Production Example 1-7

Manufacture of a Perovskite Light-Emitting Device Including a Passivation Layer

A perovskite light-emitting device is prepared in the same manner as in Production Example 1-2, and a compound represented by Formula 1-5 is used instead of the compound of Formula 5-1.

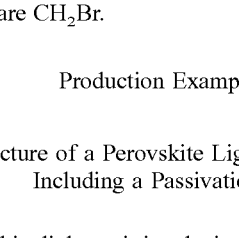

Formula 1-5

In Formula 1-5, $R_1$, $R_3$, and $R_5$ are $-C\equiv C-C(C_2H_3)$, and $R_2$, $R_4$, and $R_6$ are $CH_2Br$.

Production Example 1-8

Manufacture of a Perovskite Light-Emitting Device Including a Passivation Layer

A perovskite light-emitting device is prepared in the same manner as in Production Example 1-2, and a compound represented by Formula 1-6 is used instead of the compound of Formula 5-1.

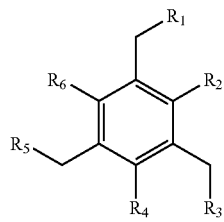

Formula 1-6

In Formula 1-6, $R_1$, $R_3$ and $R_5$ are $*-C\equiv C-C(C_3H_5)$, and $R_2$, $R_4$ and $R_6$ are $CH_2Br$.

Production Example 1-9

Manufacture of a Perovskite Light-Emitting Device Including a Passivation Layer

A perovskite light-emitting device is prepared in the same manner as in Production Example 1-2, and a compound represented by Formula 1-7 is used instead of the compound of Formula 5-1.

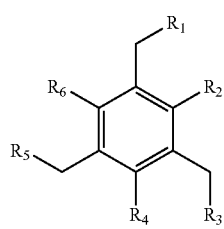

Formula 1-7

In Formula 1-7, $R_1$, $R_3$ and $R_5$ are $CH_3$, and $R_2$, $R_4$ and $R_6$ are Br.

Production Example 1-10

Manufacture of a Perovskite Light-Emitting Device Including a Passivation Layer

A perovskite light-emitting device is prepared in the same manner as in Production Example 1-2, and a compound represented by Formula 1-8 is used instead of the compound of Formula 5-1.

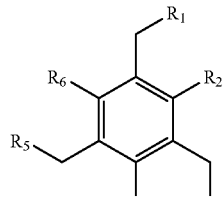

Formula 1-8

In Formula 1-8, $R_1$, $R_3$ and $R_5$ are $CH_3$, and $R_2$, $R_4$ and $R_6$ are $C_2H_4Br$.

Production Example 1-11

Manufacture of a Perovskite Light-Emitting Device Including a Passivation Layer A perovskite light-emitting device is prepared in the same manner as in Production Example 1-2, and a compound represented by Formula 1-9 is used instead of the compound of Formula 5-1.

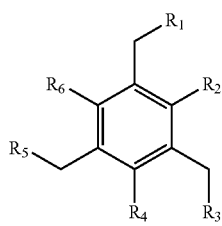

Formula 1-9

In Formula 1-9, $R_1$, $R_3$ and $R_5$ are $CH_3$, and $R_2$, $R_4$ and $R_6$ are $C_3H_6Br$.

Production Example 2-1

Manufacture of a Perovskite Light-Emitting Device Including a Passivation Layer After preparing an ITO substrate (a glass substrate coated with an ITO anode), a solution obtained by mixing a conductive material PEDOT:PSS (AI4083, Heraeus) and PFI at a weight ratio of 1:1.5 is spin-coated on the ITO anode, and then thermal-treated at 150° C. for 30 minutes to form a hole injection layer with a thickness of 50 nm.

A solution where halide perovskite nanocrystalline particles are dispersed in accordance with Production Example 1-1 is dropped 150 μL on the hole injection layer, dried for 10 minutes, spin coated, and thermally treated at 90° C. for 10 minutes to form a halide perovskite nanocrystalline particle light-emitting layer.

Next, a passivation layer is formed by spin-coating a solution for a passivation layer on a light-emitting layer having halide perovskite nanocrystalline particles and heat-treating at 90° C. for 10 minutes.

The solution for the passivation layer is prepared by mixing a compound containing a halogen group and an organic material in a non-polar solvent at a molar ratio of 1:1. In this case, the non-polar solvent is toluene, the compound containing the halogen group may be 1,3,5-tris (bromomethyl)-2,4,6-triethylbenzene (TBTB), which is a compound represented by Formula 5-1, and the organic material may be 1,3,5-tris(N-phenylbenzimidazole-2-yl) benzene (TPBI).

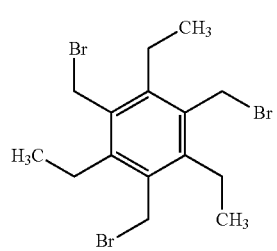

Formula 5-1

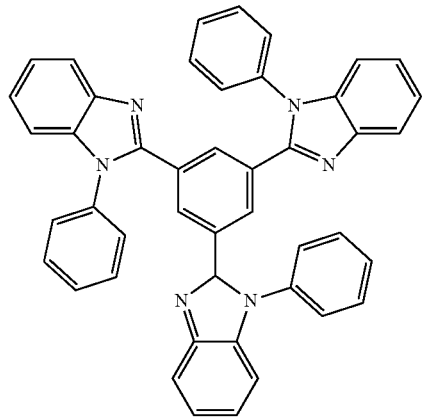

Formula 6

Formula 6 is a structural formula of TPBI.

Thereafter, 1,3,5-tris(N-phenylbenzimidazole-2-yl) benzene (TPBI) with a thickness of 50 nm is deposited on the TBTB passivation layer at a high vacuum of $1 \times 10^{-7}$ Torr or less to form an electron transport layer and LiF with a thickness of 1 nm is deposited to form an electron injection layer and thereon aluminum with a thickness of 100 nm is deposited to form a cathode, through this procedure perovskite light-emitting device is fabricated.

In addition, those skilled in the art may use an appropriate material as a passivation layer in consideration of the composition of the light-emitting layer. That is, F, Cl, or I may be selectively applied by replacing Br in TBTB to suit the emission color and the corresponding perovskite composition. That is, the passivation layer that may be used in the present example is according to Formula 5 below.

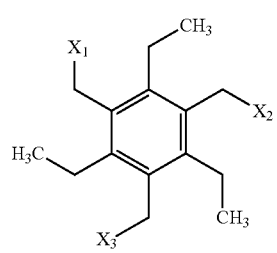

Formula 5

In Formula 5, $X_1$, $X_2$ or $X_3$ is F, Cl, Br or I.

Production Example 2-2

Manufacture of a Perovskite Light-Emitting Device Including a Passivation Layer A perovskite light-emitting device is prepared in the same manner as in Production Example 2-1, and TBMM is used as a compound containing a halogen group of a solution for a passivation layer.

Production Example 2-3

Manufacture of a Perovskite Light-Emitting Device Including a Passivation Layer A perovskite light-emitting device is prepared in the same manner as in Production Example 2-1, and polyethylene oxide (PEO), which is a polymer, is used as an organic material of a solution for a passivation layer instead of TPBI.

Production Example 2-4

Manufacture of a Perovskite Light-Emitting Device Including a Passivation Layer

A perovskite light-emitting device is prepared in the same manner as in Production Example 2-1, and a molar ratio of a compound and an organic material containing a halogen group of a solution for a passivation layer is 1:0.2.

Production Example 2-5

Manufacture of a Perovskite Light-Emitting Device Including a Passivation Layer

A perovskite light-emitting device is prepared in the same manner as in Production Example 2-1, and a molar ratio of a compound and an organic material containing a halogen group of a solution for a passivation layer is 1:12.

Comparative Production Example 1-1

Preparation of a Perovskite Light-Emitting Device Excluding a Passivation Layer

After preparing an ITO substrate (a glass substrate coated with an ITO anode), a solution obtained by mixing PEDOT:PSS (AI4083, Heraeus Co., Ltd.), which is a conductive material and PFI in a weight ratio of 1:1.5 is spin coated and heat-treated at 150° C. for 30 minutes to form a hole injection layer having a thickness of 50 nm. A solution in which halide perovskite nanocrystalline particles according to Production Example 1 are dispersed is dropped 150 µl on the hole injection layer, dried for 10 minutes, and then the undried residual solution is spin coated and thermally treated at 90° C. for 10 minutes to form an organic/inorganic hybrid perovskite nanocrystalline particle light-emitting layer.

Thereafter, 1,3,5-tris (1-phenyl-1H-benzimidazole-2-yl) benzene (TPBI) with a thickness of 50 nm is deposited in a high vacuum of $1\times10^{-7}$ Torr or less to form an electron transport layer and LiF with a thickness of 1 nm is deposited to form an electron injection layer and thereon aluminum with a thickness of 100 nm is deposited to form a cathode, through this procedure perovskite light-emitting device is fabricated.

Comparative Production Example 1-2

Manufacture of a Perovskite Light-Emitting Device Containing Another Passivation Layer 1

It is produced in the same way as Production Example 1-2 but the following compound 2,4,6-tris (bromomethyl)mesitylene (TBMM) is used as a passivation layer.

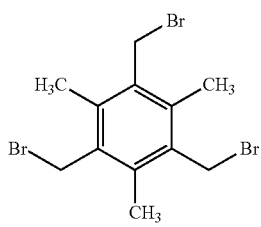

Comparative Production Example 1-3

Manufacture of a Perovskite Light-Emitting Device Containing Another Passivation Layer 2

It is produced in the same way as Production Example 1-2 but the following compound 1,3,5-tris(bromomethyl)benzene (TBB) is used as a passivation layer.

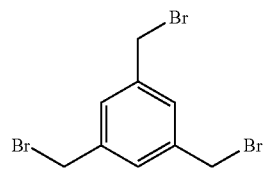 [SMILES: BrCc1cc(CBr)cc(CBr)c1]

Comparative Production Example 1-4

Manufacture of a Perovskite Light-Emitting Device Containing Another Passivation Layer 3

It is produced in the same way as Production Example 1-2 but the following compound 1,2,4,5-tetrakis(bromomethyl)benzene (TKBB) is used as a passivation layer.

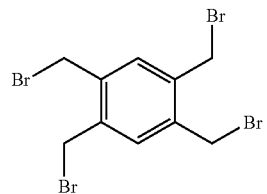 [SMILES: BrCc1cc(CBr)c(CBr)cc1CBr]

Comparative Production Example 1-5

Manufacture of a Perovskite Light-Emitting Device Containing Another Passivation Layer 4

It is produced in the same way as Production Example 1-2 but the following compound hexakis(bromomethyl)benzene (HBB) is used as a passivation layer.

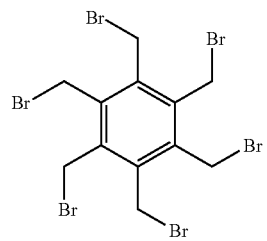 [SMILES: BrCc1c(CBr)c(CBr)c(CBr)c(CBr)c1CBr]

Comparative Production Example 1-6

Manufacture of a Perovskite Light-Emitting Device Containing Another Passivation Layer 5

It is produced in the same way as Production Example 2 but the following compound poly (pentabromophenyl methacrylate) is used as a passivation layer.

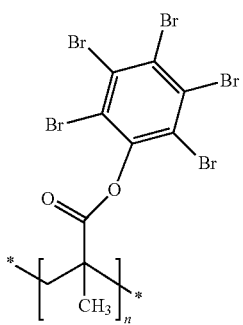

Comparative Production Example 1-7

Manufacture of a Perovskite Light-Emitting Device Containing Another Passivation Layer 6

A perovskite light-emitting device is produced in the same way as in Production Example 1-2, but a compound represented by Formula 1-10 is used instead of the compound of Formula 5-1.

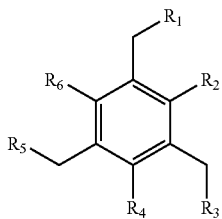

Formula 1-10

In Formula 1-10, $R_1$, $R_3$, and $R_5$ are an alkyl group having 7 carbon atoms, and $R_2$, $R_4$, and $R_6$ are $CH_2Br$.

Comparative Production Example 1-8

Manufacture of a Perovskite Light-Emitting Device Containing Another Passivation Layer 7

A perovskite light-emitting device is produced in the same way as in Production Example 1-2, but a compound represented by Formula 1-12 is used instead of the compound of Formula 5-1.

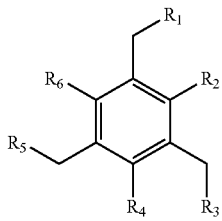

Formula 1-12

In Formula 1-10, $R_1$, $R_3$, and $R_5$ are $CH_3$, and $R_2$, $R_4$, and $R_6$ are $CH_5H_{10}Br$.

Experimental Example

Measurement of Perovskite Light-Emitting Device Characteristics

Perovskite light-emitting devices manufactured in Production Examples 1-2 to 1-11, Comparative Production Examples 1-1 to Comparative Production Examples 1-8, and Production Examples 2-1 to 2-5 are measured in the following methods and the results are shown in Tables 1 to 5.

(1) Measurement of External Quantum Efficiency (EQE)

As electrodes are connected to the light-emitting device and the voltage is increased at regular intervals in a constant voltage mode, the light generated from the device and external quantum efficiency is measured by analyzing the light through spectrometer (cs-2000) equipment and the angle-dependent electroluminescence intensity profile.

(2) Measurement of Current Density

As electrodes were connected to the light-emitting device and the voltage is increased at regular intervals in a constant voltage mode, the flowing electrical current is measured through a source measurement unit (Keithley 2400), and divided by the size of the light emitting area to measure the current density of the light-emitting device.

TABLE 1

|  |  | Production Example 1-2 | Production Example 1-3 | Production Example 1-4 | Production Example 1-5 | Production Example 1-6 |
|---|---|---|---|---|---|---|
| Material | (1) | TBTB | Formula 1-1 | Formula 1-2 | Formula 1-3 | Formula 1-4 |
|  | (2) | — | — | — | — | — |
| EQE(%) |  | 25.56 | 24.12 | 23.58 | 22.94 | 23.21 |
| current density(mA/cm$^2$) |  | 66.65 | 64.14 | 63.47 | 61.54 | 63.11 |

TABLE 2

|  |  | Production Example 1-7 | Production Example 1-8 | Production Example 1-9 | Production Example 1-10 | Production Example 1-11 |
|---|---|---|---|---|---|---|
| Material | (1) | Formula 1-5 | Formula 1-6 | Formula 1-7 | Formula 1-8 | Formula 1-9 |
|  | (2) | — | — | — | — | — |
| EQE(%) |  | 23.14 | 23.38 | 23.74 | 23.44 | 22.89 |
| current density(mA/cm$^2$) |  | 67.15 | 68.33 | 65.73 | 64.45 | 63.17 |

TABLE 3

|  |  | Comparative Production Example 1-1 | Comparative Production Example 1-2 | Comparative Production Example 1-3 | Comparative Production Example 1-4 |
|---|---|---|---|---|---|
| Material | (1) | X | TBMM | TBB | TKBB |
|  | (2) | — | — | — | — |
| EQE(%) |  | 21.65 | 22.56 | 20.23 | 19.84 |
| current density(mA/cm$^2$) |  | 71.24 | 58.84 | 54.29 | 53.67 |

TABLE 4

|  |  | Comparative Production Example 1-5 | Comparative Production Example 1-6 | Comparative Production Example 1-7 | Comparative Production Example 1-8 |
|---|---|---|---|---|---|
| Material | (1) | HBB | poly(pentabromophenyl methacrylate) | Formula 1-10 | Formula 1-11 |
|  | (2) | — | — | — | — |
| EQE(%) |  | 19.22 | 18.21 | 20.47 | 20.11 |
| current density(mA/cm$^2$) |  | 53.11 | 37.21 | 45.13 | 47.66 |

TABLE 5

|  |  | Production Example 2-1 | Production Example 2-2 | Production Example 2-3 | Production Example 2-4 | Production Example 2-5 |
|---|---|---|---|---|---|---|
| Material | Type | TBTB + TPBI | TBMM + TPBI | TBTB + PEO | TBTB + TPBI | TBTB + TPBI |
|  | Molar ratio | 1:1 | 1:1 | 1:1 | 1:0.2 | 1:12 |
| EQE(%) |  | 26.12 | 23.27 | 26.03 | 2.86 | 21.56 |
| current density(mA/cm$^2$) |  | 70.23 | 60.82 | 62.65 | 68.21 | 72.35 |

Referring to Tables 1 to 5, it is confirmed that the perovskite light-emitting devices prepared in Production Examples 1-2 to 1-11 have better external quantum efficiency and current density than Comparative Production Examples 1-1 to 1-8.

More specifically, Comparative Production Examples 1-2 (TBMM) and 1-3 (TBB) showed a decrease in current density compared to TBTB, this is predicted to be due to the shorter length of the substituent substituted with carbon adjacent to the halide of the molecule, resulting in a non-uniform arrangement of passivation molecules in the thin film, which hinders the injection of electrons into the perovskite crystal compared to healing of the surface defects, reducing the luminescence efficiency of the device.

Production Examples 1-3 to 1-5 showed higher current density and external quantum efficiency of the device than Comparative Production Examples, but compared to Production Example 1-2 (TBTB), the current density and the external quantum efficiency of the light-emitting device gradually decrease as the length of the substituent substituted carbon increases. Furthermore, as in Comparative Production Example 1-7, when the length of carbon is increased by a predetermined amount or more, it confirmed that the arrangement of passivation molecules in the thin film becomes non-uniform, and thus the current density and device efficiency decrease sharply.

Production Example 1-6 has higher current density and external quantum efficiency of the device than Comparative Production Examples, but the volume of the substituent that substitute the carbon adjacent to the carbon that has a bond with a halide is more bulky than TBTB, so that the arrangement of the passivation molecules in the film is relatively non-uniform compared to Production Example 1-2 (TBTB), exhibiting that the current density gradually decrease and the external quantum efficiency of the light-emitting device decreases.

Production Examples 1-7 to 1-8 use unsaturated compounds containing unsaturated bonds such as double bonds and triple bonds, and show higher current density and external quantum efficiency of devices compared to Comparative Production Examples, and particularly improve current density due to the presence of unsaturated bonds.

Production Examples 1-9 to 1-11 use compounds that have different lengths of the substituent containing halide and show higher current density and external quantum efficiency of the device than in Comparative Production Examples. However, as in Comparative Production Example 1-8, when the length of the substituent is extended to a predetermined length or more, it may be confirmed that the arrangement of passivation molecules in the thin film becomes non-uniform, and thus the current density and device efficiency decrease sharply.

Meanwhile, referring to Table 5, Production Example 2-1 in which the mixture of the compound and the organic material is applied as the passivation layer has excellent current density and external quantum efficiency of the device, it is predicted that this is because TPBI, an electron injection layer material, promotes the injection of electrons into the perovskite layer, improving luminescence efficiency and current density, and also the passivation material heals the defects of perovskite as TPBI does.

In addition, it is confirmed that Production Examples 2-4 to 2-5, in which the molar ratio of the compound and the organic material containing a halogen group is not in 1:0.7 to 1.4, showed somewhat poorer performance as compared with Production Example 2-1 mixed at 1:1.

Specifically, Production Example 2-4 in which the molar ratio is less than 1:0.7 shows that the current density is increased slightly but the external quantum efficiency of the light-emitting device is decreased, it is predicted to be due to the fact that the content of TPBI, an electron transport layer material, is added below a certain level, resulting in an adverse effect that prevented uniform application of TBTB while the electron injection promotion effect is insufficient.

In addition, Production Example 2-5 with a molar ratio exceeding 1:1.4 shows a significant improvement in current density but a reduction in external quantum efficiency of the light-emitting device, this is predicted because it helps injection of TPBI valence band, which are electron transport layer materials, but prevents relatively large TPBI molecules from uniformly coating TBTB and sufficiently progressing to cure defects in perovskite.

Measurement Example 1

Measurement of External Quantum Efficiency-Voltage Characteristics According to the Presence or Absence of a Passivation Layer on the Perovskite Thin Film External quantum efficiency-voltage characteristics of the light-emitting device manufactured in Production Example 1-2 and the light-emitting device manufactured in Comparative Production Example 1-1 are measured.

Figure 13:
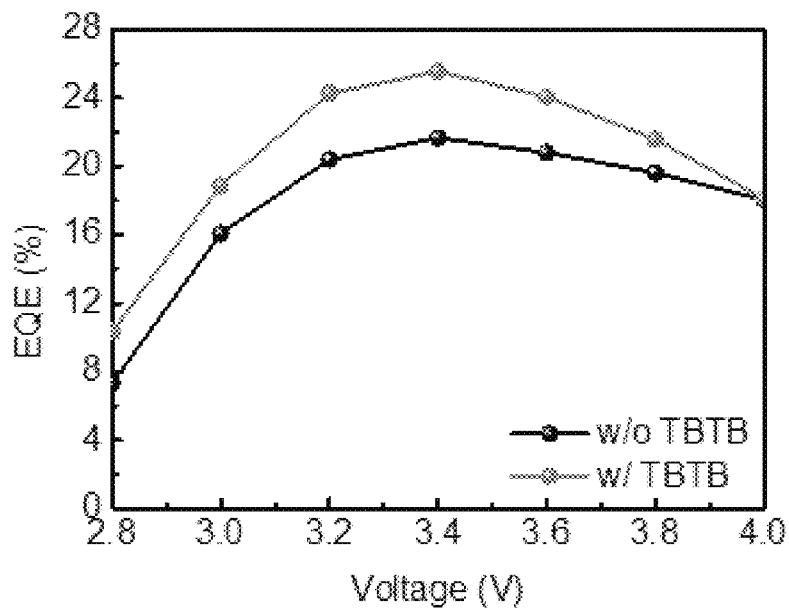
FIG. 13 is a graph illustrating external quantum efficiency according to Measurement Example 1 of the present invention.

FIG. 13 is a graph illustrating external quantum efficiency according to Measurement Example 1 of the present invention.

Referring to FIG. 13, the light-emitting device of Production Example 1-2 in which a passivation layer using TBTB is formed on the light-emitting layer exhibits higher external quantum efficiency than the light-emitting device of Comparative Production Example 1-1 having the same structure in which the passivation layer is not formed. That is, when a passivation layer using TBTB is formed, the maximum value of external quantum efficiency EQE is 25.56%, whereas when passivation layer is not involved, the maximum value of external quantum efficiency EQE remains at 21.65%. That is, it is confirmed that the external quantum efficiency increases by 1.18 times by introducing the passivation layer of the present invention.

From this, it can be seen that the passivation layer using the TBTB can be usefully used as a passivation layer by stabilizing the defect of the perovskite light-emitting layer.

Measurement Example 2

Measurement of Capacitance-Temperature Characteristics According to the Presence or Absence of a Passivation Layer on the Perovskite Thin Film The following experiment is performed to find out the change in defect density of the light-emitting device according to the presence or absence of a passivation layer containing TBTB on the perovskite light-emitting layer.

Specifically, capacitance-temperature characteristics of the light-emitting device manufactured in Production Example 2 and Comparative Production Example 1-1 are measured.

Figure 14:
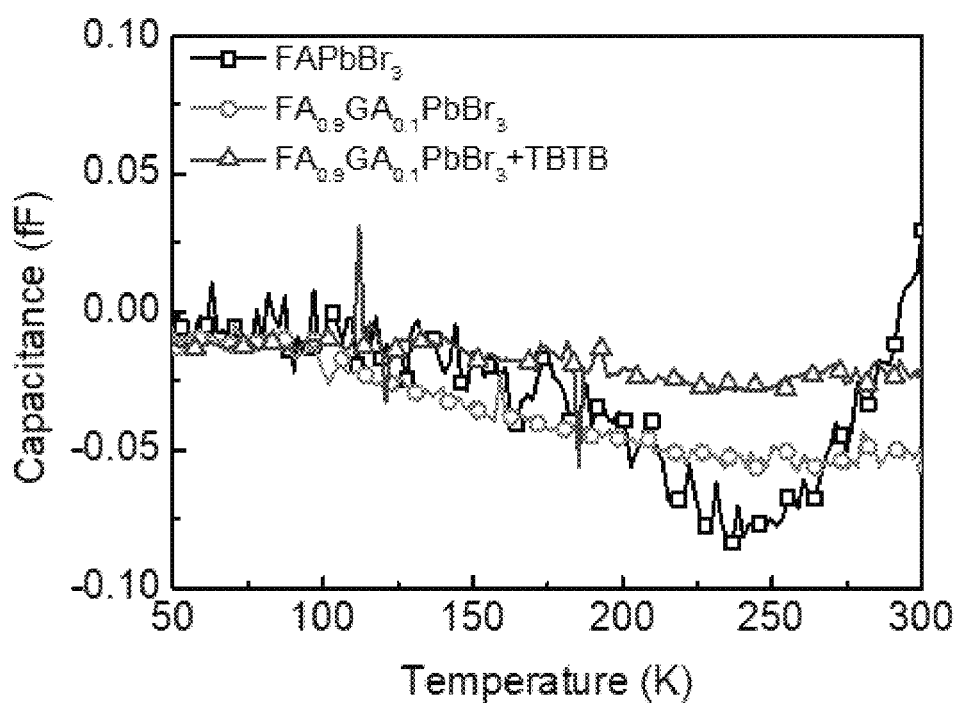
FIG. 14 is a graph illustrating capacitance-temperature characteristics of light-emitting devices according to Measurement Example 2 of the present invention.

Referring to FIG. 14, it is found that the light-emitting device of Production Example 1-2 has a reduced capacitance peak. From this, it is shown that the passivation layer using TBTB stabilizes the defect of the perovskite light-emitting layer. That is, it is confirmed that the smaller the defects of the light-emitting layer, the lower the peak intensity of the capacitance graph, and the lower the peak intensity in the 200 K to 300 K range. This is confirmed through Table 6 below.

TABLE 6

| | Defect activation energy (eV) | Defect density ($N_t$ ($cm^{-3}$)) |
|---|---|---|
| $FAPbBr_3$ | ≈0.5 | $4.93 \times 10^{12}$ |
| Production Example 1-2 | ≈0.5 | $3.10 \times 10^{12}$ |
| Production Example 1-1 | ≈0.5 | $1.70 \times 10^{12}$ |

In Table 6, the defect concentration of the light-emitting layer is calculated through deep-level transient spectroscopy. As shown in Table 1, it is confirmed that the defect density of the light-emitting layer is reduced by the passivation layer using TBTB.

Measurement Example 3

Measurement of External Quantum Efficiency/Current Efficiency-Voltage Characteristics According to the Presence or Absence of a Passivation Layer on the Perovskite Thin Film External quantum efficiency-voltage characteristics and electrical efficiency-voltage characteristics are measured for the light-emitting devices manufactured in Production Example 1-2 and Comparative Production Examples 1-2 to 1-3.

Figure 15:
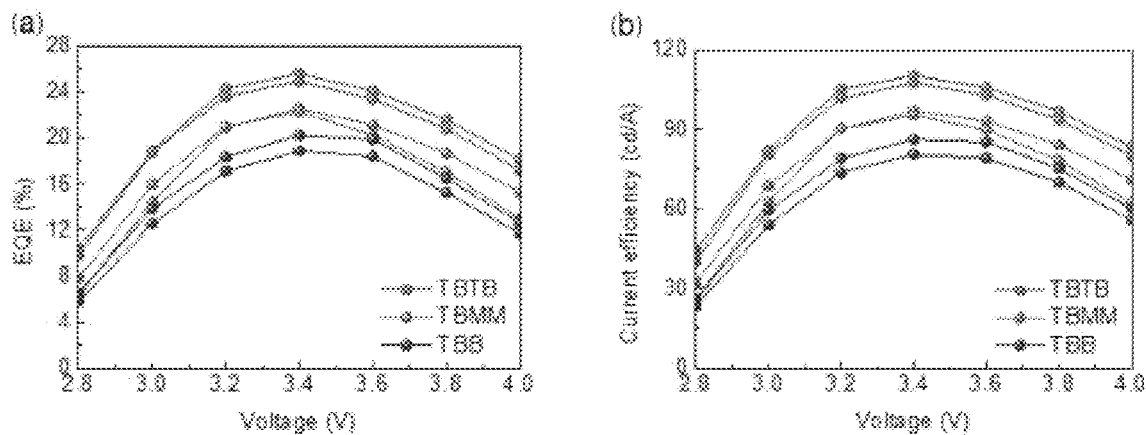
FIG. 15 is a graph illustrating external quantum efficiency-voltage characteristics and current efficiency-voltage characteristics according to Measurement Example 3 of the present invention.

FIG. 15 is a graph illustrating external quantum efficiency-voltage characteristics and current efficiency-voltage characteristics according to Measurement Example 3 of the present invention.

FIG. 15(a) illustrates external quantum efficiency-voltage characteristics. When a passivation layer using TBTB is formed on the upper part of the light-emitting layer, it may be seen that the external quantum efficiency is higher than that of light-emitting devices using other types of passivation layers.

In addition, FIG. 15(b) illustrates current efficiency-voltage characteristics. When a passivation layer using TBTB is formed on the upper part of the light-emitting layer, it can be seen that it has higher current efficiency than light-emitting devices using other types of passivation layers.

According to the graphs disclosed in FIGS. 15(a) and 15(b), the light-emitting device using TBTB as the passivation layer exhibits external quantum efficiency of up to 25.56% and current efficiency of up to 110.23 cd/A, while the light-emitting device of Comparative Production Example 1-2 using TBMM as the passivation layer has maximum external quantum efficiency of up to 22.56% and current efficiency of up to 96.95 cd/A. In addition, the light-emitting device of Comparative Production Example 1-3 using TBB as a passivation layer exhibit an external quantum efficiency of up to 20.23% and a current efficiency of up to 86.3 cd/A.

That is, the increase in external quantum efficiency and current efficiency in the same structure is due to the reduction of defects in the light-emitting layer and the securing of structural stability. That is, changes in characteristics in the light-emitting layer having the same thickness and the same material are directly related to reduction of defects in the light-emitting layer.

Measurement Example 4

Measurement of Characteristics According to the Holding Time (Waiting Time) of the Solution when Forming the Perovskite Thin Film In Production Example 1-2, a process of dropping a solution in which perovskite nanocrystalline particles are dispersed in order to form a perovskite light-emitting layer and drying the solution by providing a holding time for 10 minutes is disclosed.

However, the holding time given in Production Example 1-2 corresponds to one production example, and it is desirable that the holding time is 1 minute to 50 minutes. Specifically, it can be 1 min, 2 mins, 3 mins, 4 mins, 5 mins, 6 mins, 7 mins, 8 mins, 9 mins, 10 mins, 11 mins, 12 mins, 13 mins, 14 mins, 15 mins, 20 mins, 30 mins, 40 mins, or 50 mins. The thickness of the thin film varies depending on the holding time, and the conditions vary depending on the temperature and humidity of the glove box and atmosphere at the time of forming the thin film. The perovskite thin film acting as the light-emitting layer by imparting the holding time before rotation may become denser and obtain superior optical properties. However, if the holding time is less than 1 minute, it is not possible to obtain a dense thin film because the alignment of the nanocrystalline particles located at the lower part or fixing thereof on the lower part of the film is not smooth. In addition, if the holding time exceeds 50 minutes, the process time increases, and it is difficult to obtain uniformity of the thin film by spin coating as the solvent evaporates. Preferably, a time of 2 minutes to 15 minutes may be used in a conventional process. If the holding time is extended, the ligand will float further upward, which can further control defects on the surface. In addition, since the ligand can act as an insulator, additional process of spin-coating can be used only using the solvent to remove only the ligand from the top. This process is called a ligand removal process.

In this production example, the holding time is given for 10 minutes. Even if a holding time of 10 minutes is given, all of the dropped solution is not dried, and the undried solution is coated through spinning.

Figure 16:
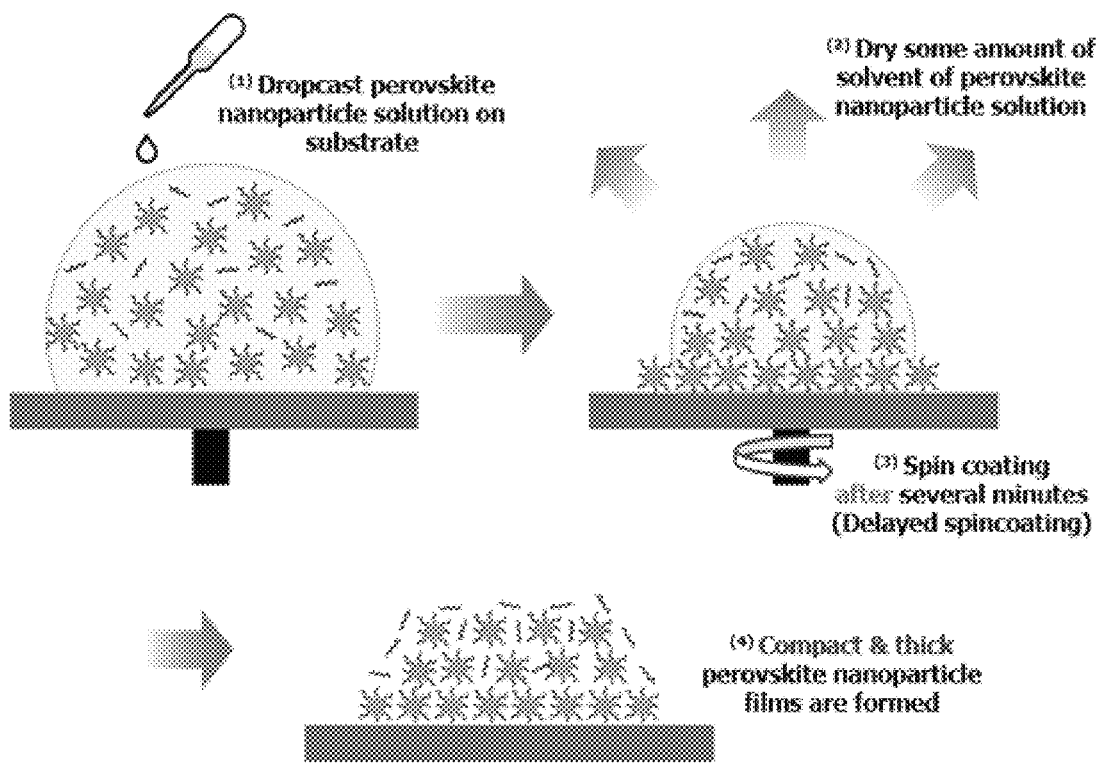
FIG. 16 is a schematic diagram of forming the perovskite light-emitting layer by giving a holding time according to Measurement Example 4 of the present invention.

FIG. 16 is a schematic diagram of forming a perovskite light-emitting layer by imparting a holding time according to Measurement Example 4 of the present invention.

Referring to FIG. 16, a solution in which perovskite nanocrystalline particles are dispersed is dropped onto a substrate or other functional film.

In addition, when the dropped solution is in a solution state on the underlying substrate (electrode or hole injection layer), spin coating is not immediately performed, and a holding time is given. When the holding time is given, the solvent partially evaporates, and perovskite nanocrystalline particles are immobilized on the surface in contact with the substrate or other film. Thereafter, when spin coating of the solution remaining at upper part is performed, a light-emitting layer having a uniform thickness may be formed.

Figure 17:
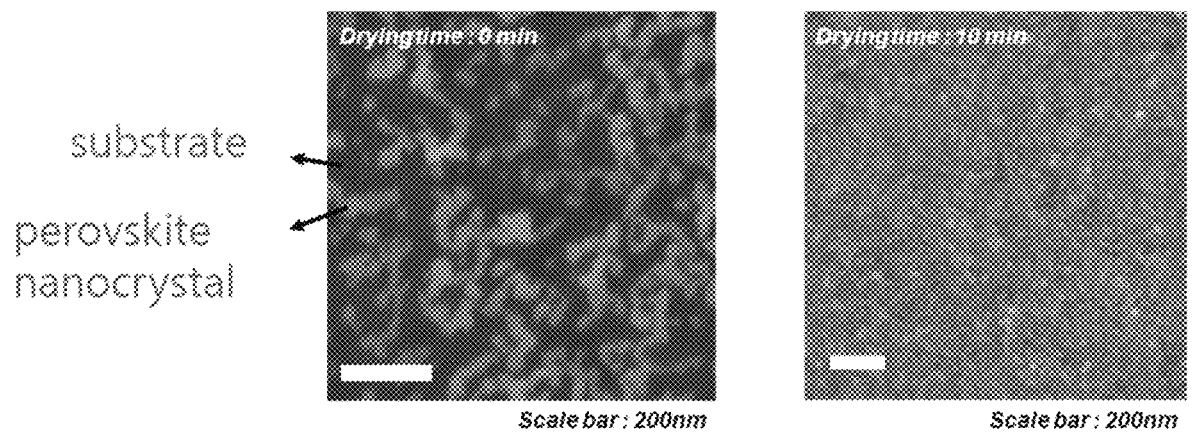
FIG. 17 is a SEM image of the perovskite light-emitting layer following the holding time, according to Measurement Example 4 of the present invention.

FIG. 17 is an SEM image of a perovskite light-emitting layer according to a holding time following the Measurement Example 4 of the present invention.

Referring to FIG. 17A, in a film in which a waiting time is not given after conducting of the solution and spin coating is immediately performed, coagulation due to attraction between particles occurs. That is, it is confirmed that a dense and uniform film quality cannot be obtained. On the other hand, referring to FIG. 17B, it is found that the density of the thin film of the perovskite light-emitting layer having a holding time of a predetermined time or more is higher than that of the light-emitting layer not having the holding time disclosed in FIG. 17A.

Accordingly, it is confirmed that the holding time before coating can be usefully used in a method capable of increasing luminescence efficiency and forming a high-performance light-emitting layer by improving the density of the perovskite thin film.

Figure 18:
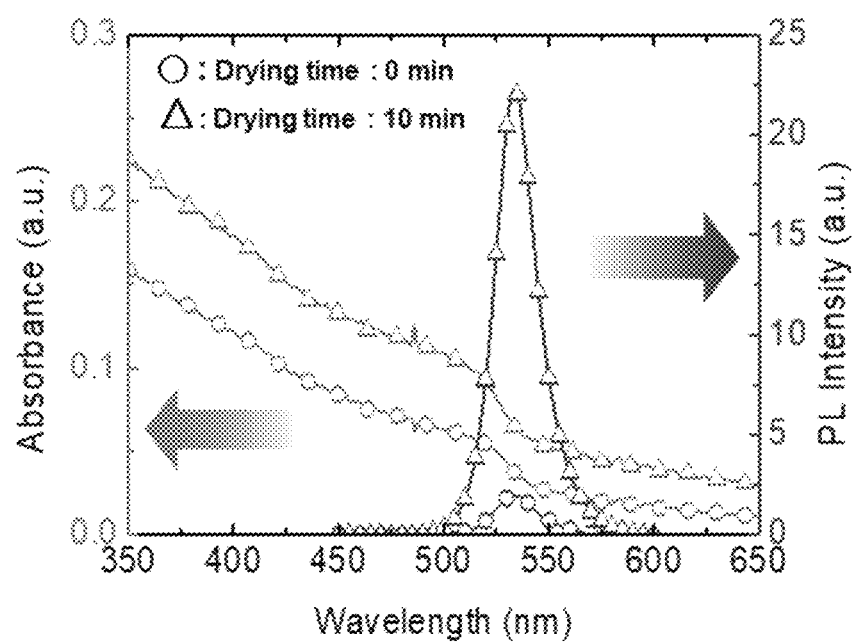
FIG. 18 is a graph showing the photoluminescence and absorbance of the perovskite light emitting layer following the holding time, according to Measurement Example 4 of the present invention.

FIG. 18 is a graph of photoluminescence and absorbance of a perovskite light-emitting layer according to a holding time according to Measurement Example 4 of the present invention.

Referring to FIG. 18, it is found that the perovskite light-emitting layer having a holding time of more than or equal to a predetermined time has higher photoluminescence and absorbance of a thin film than the light-emitting layer not having a holding time. That is, a large difference appears in the photoluminescence characteristics and absorbance of the light-emitting device of Production Example 1-2 to which 10 minutes holding time is given from the light-emitting device of Production Example 1-2 to which the holding time is not given. The peak of photoluminescence (indicated by PL) appears at 534 nm identically. However, it is confirmed that the photoluminescence intensity of the sample imparting a holding time of 10 minutes is 22.33 a.u., which is about 11.5 times increased compared to the intensity of the sample without a holding time of 1.95 a.u. In addition, it is confirmed that the intensity of absorbance increased by about 1.5 times from 0.123 a.u. to 0.179 a.u. at 400 nm. From this, it is confirmed that the holding time before coating can be usefully used in a method of forming a high-performance light-emitting layer by improving the density and light characteristics of the perovskite thin film.

Figure 19:
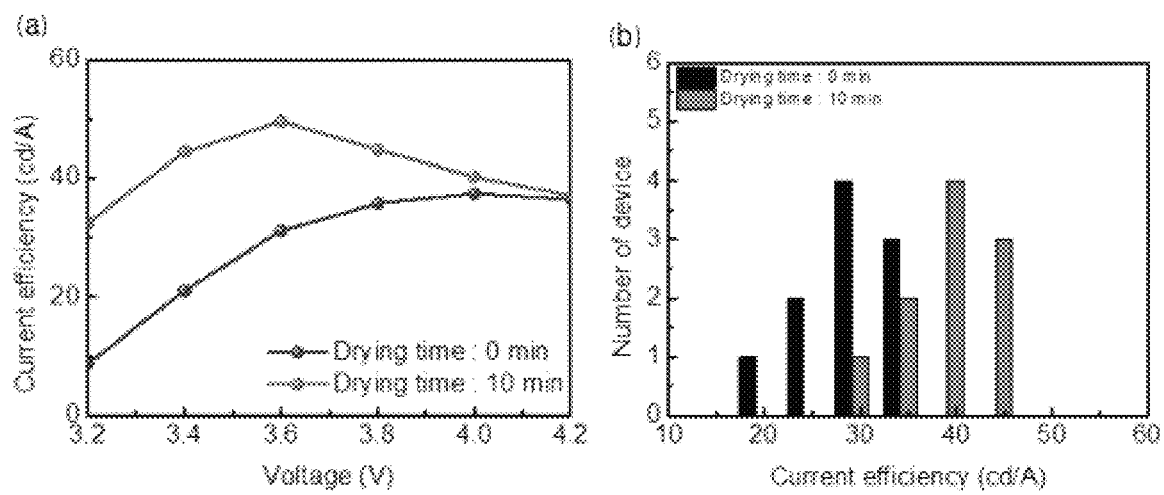
FIG. 19 is a graph measuring current efficiency of the perovskite light emitting layer following the holding time, according to Measurement Example 4 of the present invention.

FIG. 19 is a graph measuring current efficiency of a perovskite light-emitting layer depending on the holding time according to the Measurement Example 4 of the present invention.

Referring to FIG. 19a, it is found that the current efficiency of the device with a holding time of a predetermined time or more is increased compared to the thin film without the holding time of the perovskite thin film. That is, when the holding time of 10 minutes is conducted, the maximum current efficiency is 49.6 cd/A, which is very high compared to the maximum current efficiency of 37.4 cd/A otherwise.

In addition, referring to FIG. 19B, the current efficiency of multiple samples to which the holding time is not imparted and multiple samples to which the holding time is 10 minutes are compared as disclosed in Production Example 1-2. It is confirmed that current efficiency of the sample with a holding time is improved than sample without a holding time.

Accordingly, it is confirmed that the holding time before spin coating can be usefully used as a method of forming a high-performance light-emitting layer by improving the density of the perovskite thin film and blocking a leakage path of charge carriers.

Production Example 3

Manufacture of a Perovskite Light-Emitting Device Using an Organic Ligand Removal Process and Including a Passivation Layer A perovskite light-emitting device is manufactured in the same process as in Production Example 1-2. However, when the perovskite light-emitting layer is formed, a holding time of 10 minutes is given and spin coating is performed, and then 0.7 ml of toluene is dropped and spin coated on a thin film on which spin coating is performed. Thereafter, heat treatment is performed at 90° C. in the same manner as in Production Example 1-2, thereby forming a perovskite light-emitting layer.

Figure 20:
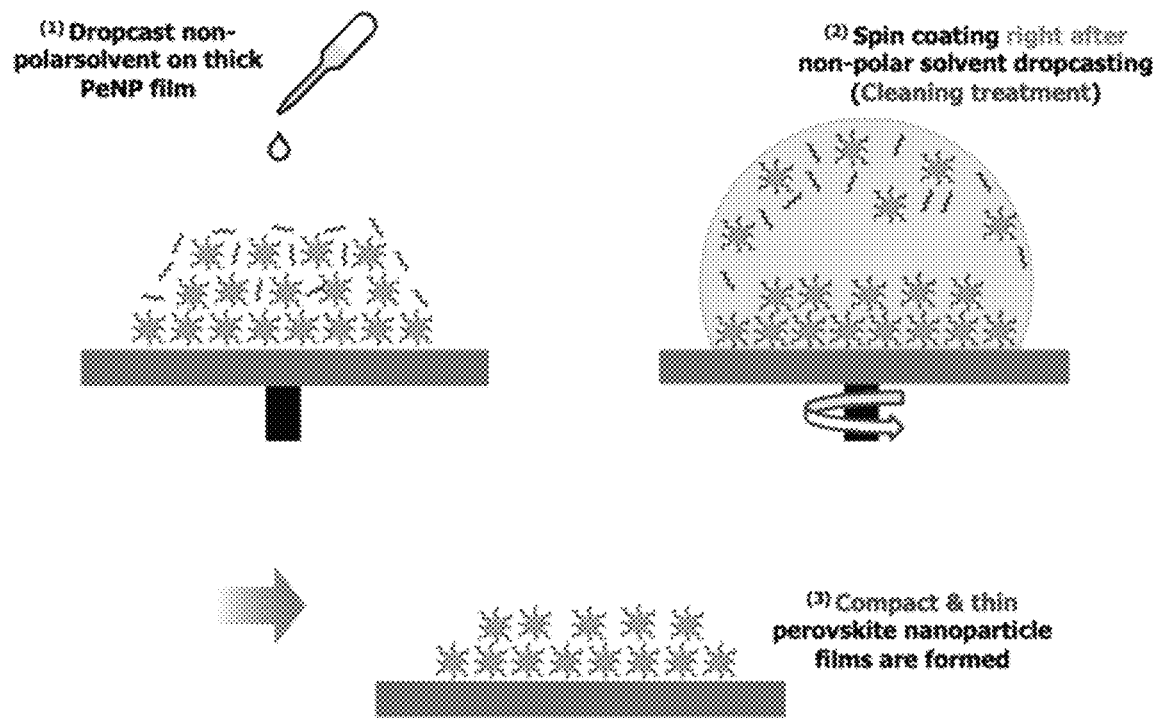
FIG. 20 is a schematic diagram illustrating a ligand removal process according to Production Example 3 of the present invention.

FIG. 20 is a schematic diagram illustrating a ligand removal process according to Production Example 3 of the present invention.

Organic ligands stemmed from surfactants are distributed in the perovskite nanocrystalline particle solution. Organic ligands bind to the surface of nanocrystalline particles to prevent aggregation between nanocrystal particles. However, organic ligands that are not bonded to the surface of the nanocrystalline particles float in the solution. They can be removed through toluene.

Measurement Example 5

Measurement of Perovskite Light-Emitting Device Characteristics According to the Presence or Absence of an Organic Ligand Removal Process In the present measurement example, the light-emitting device of Production Example 1-2 and the light-emitting device of Production Example 3 are compared.

Figure 21:
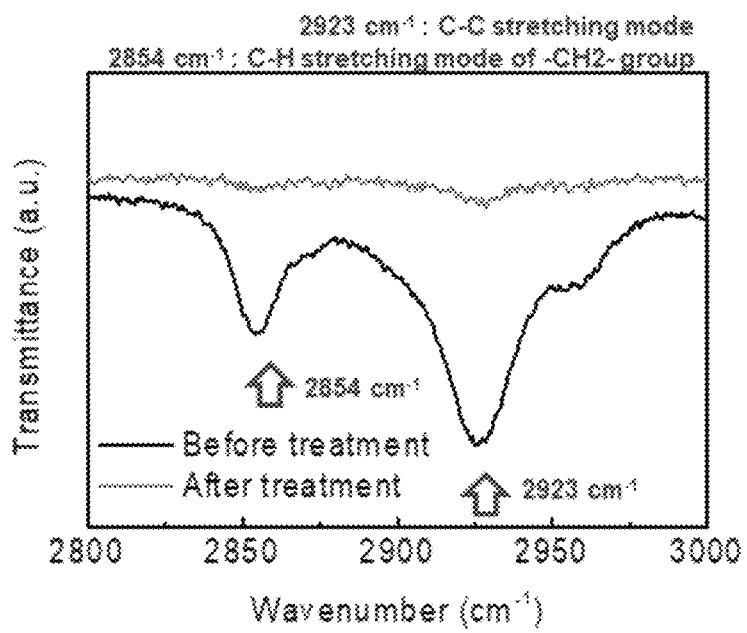
FIG. 21 is a graph illustrating FTIR data of the perovskite light emitting layer in the light-emitting devices according to Measurement Example 5 of the present invention.

FIG. 21 is a graph illustrating FTIR data of a perovskite light-emitting layer in the light-emitting devices according to Measurement Example 5 of the present invention.

Referring to FIG. 21, it is confirmed that the peak corresponding to oleic acid (the organic ligand) is significantly reduced in the sample of Production Example 3 to which the organic ligand removal process is applied. Accordingly, it can be confirmed that not only the thickness of the thin film is reduced but also the side effects due to excessive organic ligand are solved, the injection of charges is facilitated, and efficiency is improved.

Figure 22:
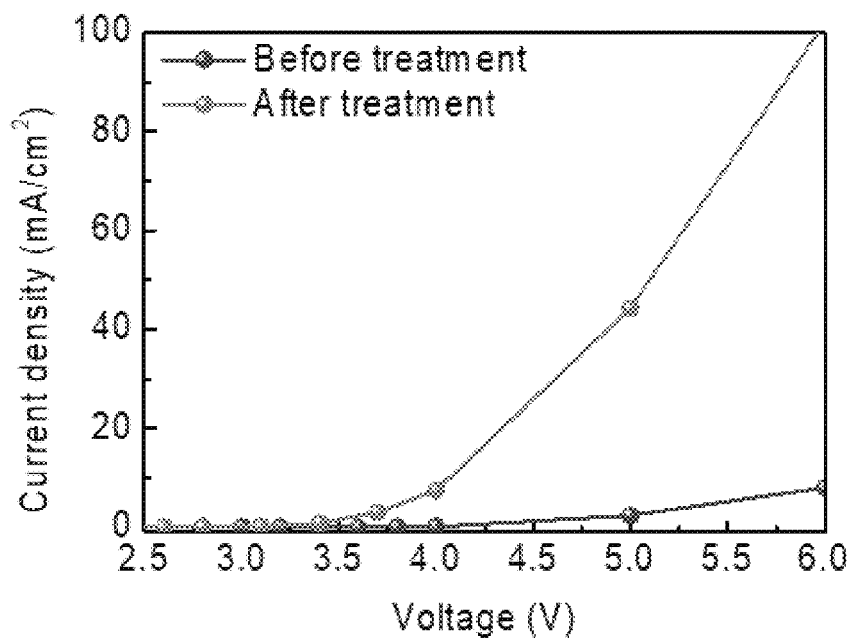
FIG. 22 is a graph illustrating current density of light-emitting devices according to Measurement Example 5 of the present invention.

FIG. 22 is a graph illustrating current density of light-emitting devices according to Measurement Example 5 of the present invention.

Figure 23:
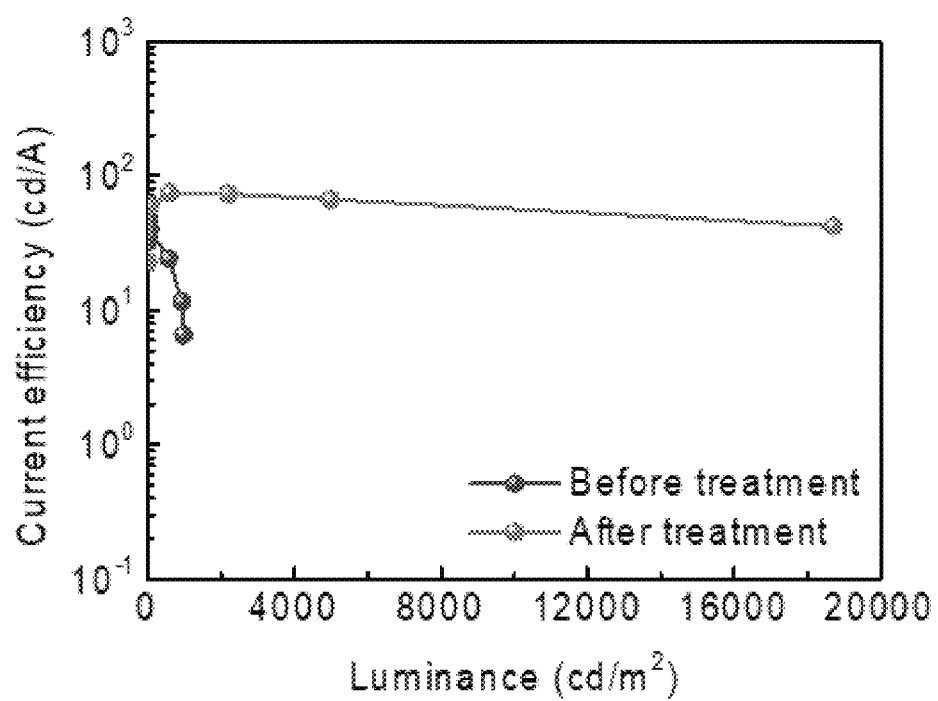
FIG. 23 is a graph illustrating current efficiency and luminance of light-emitting devices according to Measurement Example 5 of the present invention.

Referring to FIG. 22, it is confirmed that the light-emitting device of Production Example 3 has a higher current density than the light-emitting device of Production Example 1-2. It is confirmed that a kind of insulation effect or charge movement impediment operation due to the organic ligand floating in the solution is resolved and the performance of the light-emitting device is improved. FIG. 23 is a graph illustrating current efficiency and luminance of light-emitting devices according to Measurement Example 5 of the present invention.

Referring to FIG. 23, the light-emitting device of Production Example 3 shows current efficiency of up to 75.1 cd/A, and the light-emitting device of Production Example 1-2 shows current efficiency of up to 49.6 cd/A. In addition, the light-emitting device of Production Example 3 has a luminance of up to 18,709 cd/m$^2$, and the light-emitting device of Production Example 1-2 has a luminance of up to 971 cd/m$^2$. That is, it can be seen that the light-emitting device on which the organic ligand removal process has been performed and thus the organic ligands are not bonded to the perovskite, and the organic ligand remaining in the thin film is sufficiently removed, thereby exhibiting high current efficiency and luminance characteristics.

Production Example 4

Manufacture of a Perovskite Light-Emitting Device Including a Passivation Layer Using a Bar Coating After preparing an ITO substrate (a glass substrate coated with an ITO anode), a solution obtained by mixing a conductive material PEDOT:PSS (AI4083, Heraeus) and PFI at a weight ratio of 1:1.5 is spin-coated on the ITO anode, and then thermal-treated at 150° C. for 30 minutes to form a hole injection layer with a thickness of 50 nm.

And then, a bar coating is performed immediately after 150 μL of a solution where halide perovskite nanocrystalline particles are dispersed in accordance with Production Example 1-1 is dropped onto the hole injection layer. In the bar-coating process, the substrate is tilted to 50° to remove the solvent and simultaneously align the nanocrystalline particles. Thereafter, heat treatment is performed at 90° C. for 10 minutes to form a halide perovskite nanocrystalline particle light-emitting layer.

Next, a solution where 1,3,5-tris(bromomethyl)-2,4,6-triethylbenzene (TBTB) is dissolved is spin-coated on a halide perovskite nanocrystalline particle light-emitting layer and thermal-treated at 90° C. for 10 minutes to form a passivation layer.

Thereafter, 1,3,5-tris (1-phenyl-1H-benzimidazole-2-yl) benzene (TPBI) with a thickness of 50 nm is deposited on the passivation layer at a high vacuum of $1 \times 10^{-7}$ Torr or less to form an electron transport layer and LiF with a thickness of 1 nm is deposited to form an electron injection layer and thereon aluminum with a thickness of 100 nm is deposited to form a cathode, through this procedure perovskite light-emitting device is fabricated.

FIG. 24 is a schematic diagram illustrating a bar coating applied to form a perovskite light-emitting layer according to Production Example 4 of the present invention.

Measurement Example 6

Measurement of the Properties of the Perovskite Thin Film Manufactured Through Bar Coating As disclosed in Production Example 4, during coating, the characteristics of the light-emitting device are measured depending on the inclination of the substrate with respect to the horizontal plane and the presence or absence of bar coating.

Figure 25:
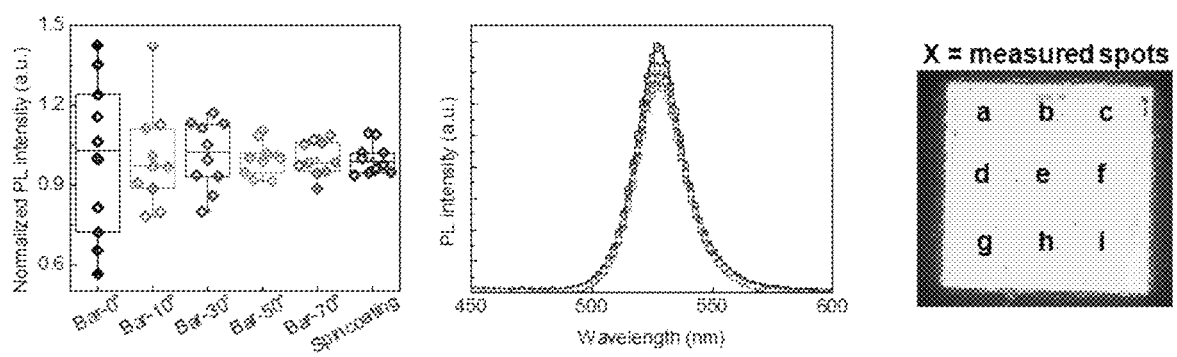
FIG. 25 is a graph and an image measuring a photoluminescence distribution according to Measurement Example 6 of the present invention.

FIG. 25 is a graph and an image measuring a photoluminescence distribution according to Measurement Example 6 of the present invention.

Figure 26:
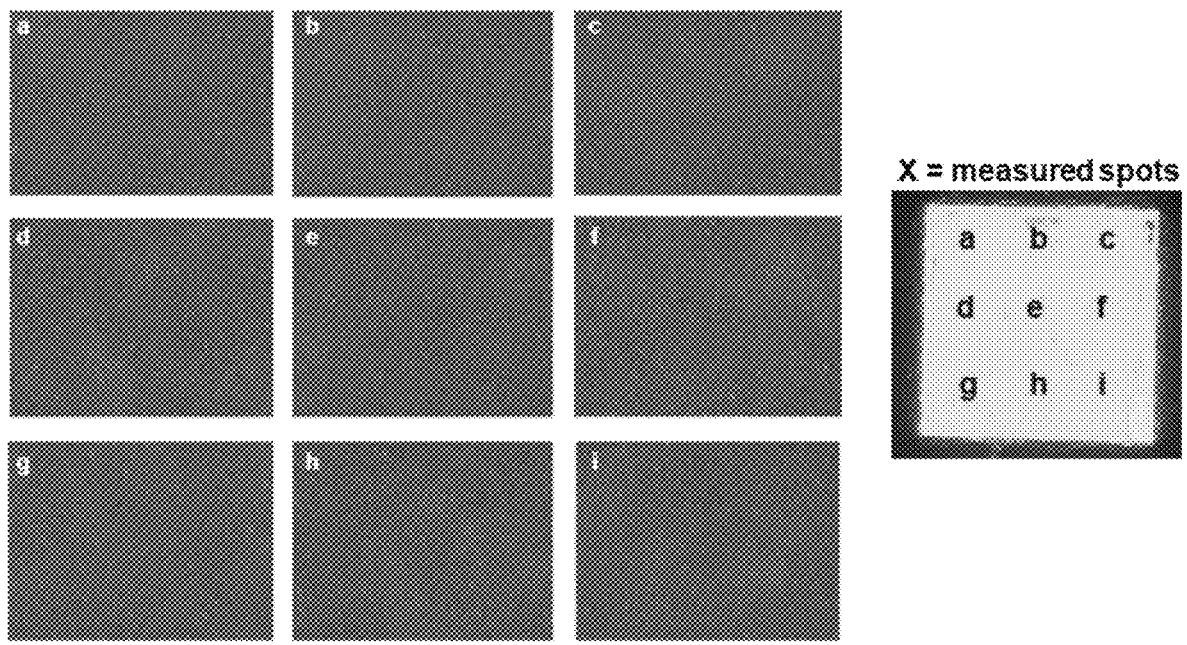
FIG. 26 is a SEM image illustrating surface uniformity of the light emitting layer according to Measurement Example 6 of the present invention.

Referring to FIG. 25, light emission properties at nine points (a to I) are measured after applying bar coating. In addition, during bar coating, the inclination angle of the substrate is changed to 0° to 70° and is compared to the measured values of those by spin coating. Spin coating is advantageous in forming an light-emitting layer having a small area, but bar coating is essential for forming an light-emitting layer having a large area. In FIG. 26, when the substrate has an inclination angle of 30° to 70° with respect to the horizontal plane, a distribution similar to that of the spin coating is shown. In addition, when the inclination angle is 50° to 70°, it is confirmed that it exhibits almost the same photoluminescence characteristics as the spin coating.

This shows that if a specific inclination angle is imparted from bar coating, the same characteristics as spin coating, which is advantageous for coating with a small area, is achieved and even if bar coating is used in a large light-emitting layer forming process, a thin film with a uniform thickness can be obtained.

FIG. 26 is an SEM image illustrating surface uniformity of a light-emitting layer according to Measurement Example 6 of the present invention.

Referring to FIG. 26, when an inclination angle of 50° is applied, a very uniform thin film is obtained and a thin film with minimized surface defects is obtained.

Figure 27:
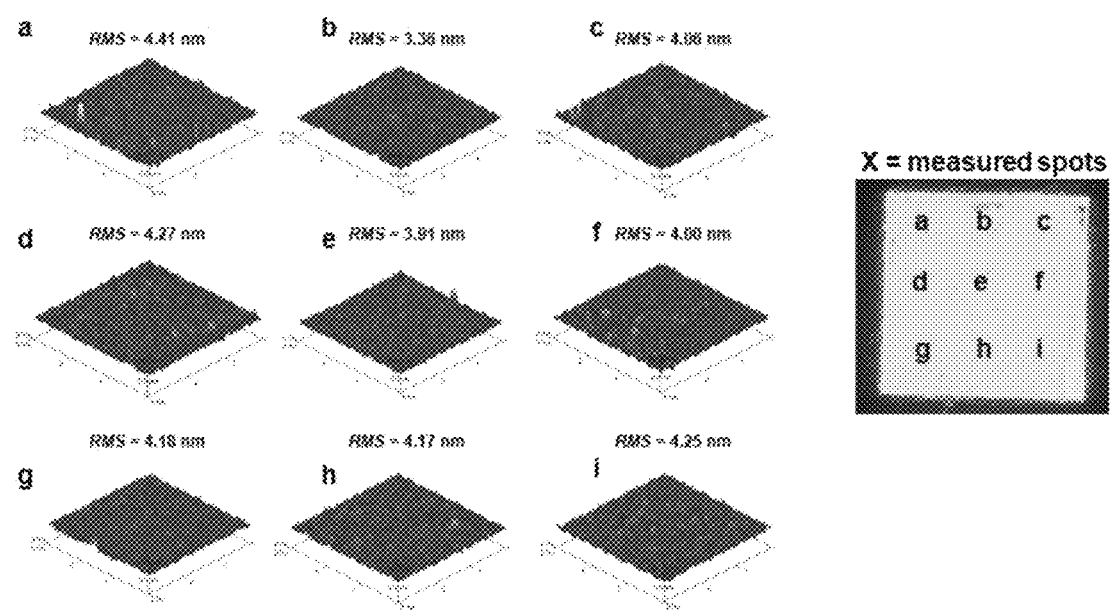
FIG. 27 is an AFM image illustrating surface uniformity of the light emitting layer according to Measurement Example 6 of the present invention.

FIG. 27 is an AFM image illustrating surface uniformity of a light-emitting layer according to Measurement Example 6 of the present invention.

Referring to FIG. 27, when an inclination angle of 50° is applied, the surface roughness of the light-emitting layer surface of Production Example 3 is measured at nine points. It is confirmed that a thin film is uniformly formed with low surface roughness over the entire area.

Figure 28:
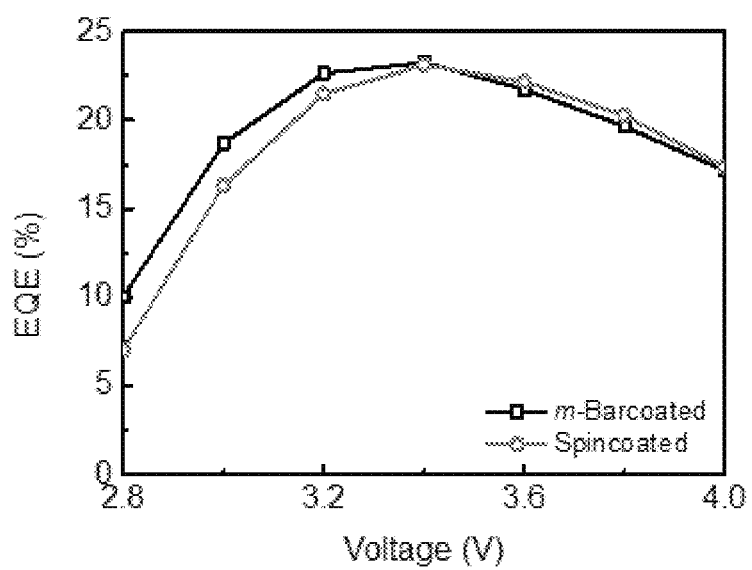
FIG. 28 is a graph illustrating external quantum efficiency and luminance characteristics of the light-emitting device according to Measurement Example 6 of the present invention.

FIG. 28 is a graph illustrating external quantum efficiency and luminance characteristics of a light-emitting device according to Measurement Example 6 of the present invention.

Referring to FIG. 28, external quantum efficiency and luminance characteristics of the light-emitting device of Production Example 3 in which spin coating is performed to form the light-emitting layer and the light-emitting device of Production Example 4 in which bar coating is performed are compared.

The external quantum efficiency of light-emitting device on which the bar coating have been performed is higher than external quantum efficiency of light-emitting device on which spin coating have been performed at a lower voltage. This is due to the fact that the surface defect of the bar-coated light-emitting layer is reduced and the film density is improved compared to the spin coating. In addition, at a low voltage, the luminance is higher in the light-emitting layer formed by the bar coating than in the light-emitting layer formed by the spin coating.

In addition, at 3.3 V or higher, which corresponds to a relatively high voltage, there is no difference in external quantum efficiency of the two types of light-emitting devices. In particular, the maximum value of external quantum efficiency over the entire range is 23.26% for the sample of Production Example 4 where the bar coating is performed, and the sample of Production Example 3 where the spin coating is performed has a maximum value of 23.11%. That is, it may be seen that the light-emitting device on which the bar coating has been performed over the entire range has high external quantum efficiency.

However, those skilled in the art may selectively apply a process of forming a perovskite light-emitting layer depending on operating conditions and specifications of the light-emitting device. In other words, if the operating voltage (voltage difference between cathode and anode) is 3.5 V or less, high external quantum efficiency and luminance could be obtained by bar coating, and if the operating voltage exceeds 3.5 V, it is desirable to perform spin coating. In addition, when a large-area light-emitting device is to be manufactured, desired properties may be secured by performing bar coating.

As described above, the perovskite light-emitting device according to the present invention has a passivation layer, which may include TBTB, on the perovskite light-emitting layer. Accordingly, defects of perovskite nanocrystalline particles forming the light-emitting layer are alleviated and charge imbalance in the device is resolved to improve light emission efficiency and maximum luminance, which can be usefully used in place of conventional perovskite devices.

On the other hand, the embodiments of the invention disclosed in this specification and drawings merely present specific examples to aid understanding and are not intended to limit the scope of the invention. It is obvious to those skilled in the art that other modified examples based on the technical idea of the present invention may be implemented in addition to the embodiments disclosed herein.

The invention claimed is:

1. A perovskite light-emitting device, comprising:
a substrate;
a first electrode positioned on the substrate above;
a perovskite thin film positioned on the first electrode above;
a passivation layer including Formula 1, and disposed on the perovskite thin film; and
a second electrode positioned on the passivation layer;

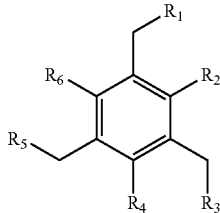

Formula 1

(In Formula 1, R1, R3 or R5 is an alkyl group having 1 to 10 carbon atoms, an alkenyl group or alkynyl group having 2 to 10 carbon atoms, a cycloalkyl group having 3 to 10 carbon atoms, a cycloalkenyl group or a heteroalkenyl group having 3 to 10 carbon atoms, an aryl group or aryloxy group having 6 to 30 carbon atoms, or a heteroaryl group having 2 to 30 carbon atoms, and R2, R4 or R6 is a halogen or a halogenated alkyl group having 1 to 10 carbon atoms, a halogenated alkenyl group or halogenated alkynyl group having 2 to 10 carbon atoms).

2. The perovskite light-emitting device of claim 1,
wherein the passivation layer further includes the organic semiconductor or polymer,
wherein the organic semiconductor includes at least one selected from Tris-(8-hydroxyquinoline) aluminum (Alq3), 3-(4-Bipenylyl)-4-phenyl-5-tert-butylphenyl-1,2,4-triazole (TAZ), Tris-Phenylquinoxalines 1,3,5-tris [(3-phenyl-6-trifluoromethyl) quinoxaline-2-yl] benzene (TPQ1), Tris-Phenylquinoxalines 1,3,5-tris [{3-(4-tert-butyl)-6-trifluoromethyl} quinoxaline-2-yl] benzene (TPQ2), 4,7-diphenyl-1,10-phenanthroline (Bphen), 2,9-dimethyl-4,7-diphenyl-1,10-phenanthroline (BCP), 10-benzo[h]quinolinol-beryllium (BeBq2), (Bis(8-hydroxy-2-methylquinoline)-(4-phenylphenoxy)aluminum (BAlq), 4,4'-N,N'-Dicabazol-biphenyl (CBP), 9,10-di(naphthalene-2-yl)anthracene (AND), 4,4',4''-Tris(N-cabazolyl)triphenylamine (TCTA), 1,3,5-tris(N-phenylbenzimidazole-2-yl)benzene (TPBI), 3-tert-butyl-9,10-di(naphtha-2-il)anthracene(TBADN), (1,3,5-triazine-2,4,6-triyl)tris (benzene-3,1-dyle)tris (diphenylphosphine oxide), 2,4,6-tris[3-diphenylphosphinyl]phenyl-1,3,5-triazine (PO-T2T), Tris (2,4,6-trimethyl-3-(pyridin-3-yl)phenyl)borane (3TPYMB), 4,6-bis(3,5-di(pyridin-3-yl)phenyl)-2-methylpyrimidine (B3PYMPM), and 2-[4-(9,10-di-naphthalen-2-yl-anthracen-2-yl)-phenyl]-1-phenyl-1H-benzoimidazole (ZADN),
wherein the polymer includes at least one selected from poly (Methyl Methacrylate) (PMMA), poly (ethyl methacrylate) (PEMA), poly (butyl methacrylate) (PBMA), poly (2-ethyl-2-oxazoline (PEOXA), polyacrylamide (PAM), and polyethylene oxide (PEO).

3. The perovskite light-emitting device of claim 1, wherein the passivation layer includes a compound represented by Formula 5:

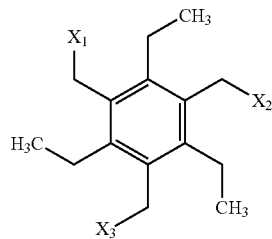

In Formula 5, X1, X2 or X3 is F, Cl, Br or I.

4. The perovskite light-emitting device of claim 3, wherein the X1, X2 and X3 are the same halogen element.

5. The perovskite light-emitting device of claim 1,
wherein when the compound represented by Formula 2, Formula 3, or Formula 4 is used for the passivation layer, an organic material has at least one selected from an organic semiconductor and a polymer is included in a molar ratio of 1:0.3 to 1:10 in the passivation layer with respect to at least one compound of Formulas 2 to 4.

6. The perovskite light-emitting device of claim 1,
wherein the perovskite light-emitting device further includes a hole injection layer or an electron transport layer between the first electrode and the perovskite thin film, or between the passivation layer and the second electrode.

7. The perovskite light-emitting device of claim 1,
wherein the perovskite thin film includes perovskite nanocrystalline particles, and the perovskite nanocrystalline particles include perovskite nanocrystals and organic ligands bonded to the surface of the perovskite nanocrystal.

8. The perovskite light-emitting device of claim 7, wherein the perovskite nanocrystalline particle has a core-shell structure.

9. The perovskite light-emitting device of claim 7, wherein the perovskite nanocrystalline particle has a gradient composition.

10. The perovskite light-emitting device of claim 7, wherein the perovskite nanocrystalline particle is doped an n-type or p-type manner.

11. The perovskite light-emitting device of claim 7, wherein the perovskite nanocrystalline particle has a diameter larger than the exciton Bohr diameter.

12. A method of manufacturing a perovskite light-emitting device, comprising:
 forming a first electrode on a substrate;
 forming a perovskite thin film on the first electrode;
 forming a passivation layer containing compound (1) or a mixture of compound (1) and compound (2) on the perovskite thin film; and
 forming a second electrode on the passivation layer,
 wherein the compound (1) has a compound of Formula 1 below,

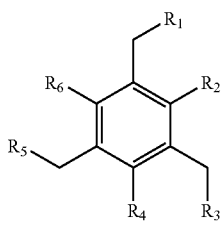

Formula 1

(In Formula 1, R1, R3 or R5 is an alkyl group having 1 to 10 carbon atoms, an alkenyl group or alkynyl group having 2 to 10 carbon atoms, a cycloalkyl group having 3 to 10 carbon atoms, a cycloalkenyl group or a heteroalkenyl group having 3 to 10 carbon atoms, an aryl group or aryloxy group having 6 to 30 carbon atoms, or a heteroaryl group having 2 to 30 carbon atoms, and R2, R4 or R6 is a halogen or a halogenated alkyl group having 1 to 10 carbon atoms, a halogenated alkenyl group or halogenated alkynyl group having 2 to 10 carbon atoms.)

wherein the compound (2) has a mixture of a compound of Formula 2, Formula 3, or Formula 4 below, and organic material including at least one selected from organic semiconductors and polymers.

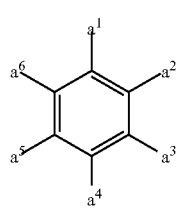

Formula 2

(In Formula 2, a1 to a6 are each independently an alkyl group or alkoxy group having 1 to 10 carbon atoms, an alkenyl group or alkynyl group having 2 to 10 carbon atoms, a cycloalkyl group, cycloalkenyl group or heteroalkenyl group having 3 to 10 carbon atoms, an aryl group or aryloxy group having 6 to 30 carbon atoms, heteroaryl group having 2 to 30 carbon atoms, halogen, halogenated alkyl group having 1 to 10 carbon atoms, an halogenated alkenyl group or halogenated alkynyl group having 2 to 10 carbon atoms)

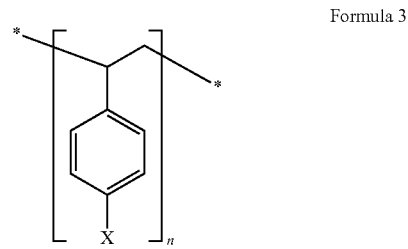

Formula 3

(In Formula 3, X is halogen elements, and n is an integer from 1 to 100)

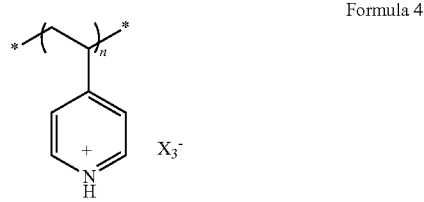

Formula 4

(In Formula 4, X is halogen elements, and n is an integer from 1 to 100).

13. The method of manufacturing a perovskite light-emitting device of claim 12, wherein the perovskite thin film is formed through spin coating.

14. The method of manufacturing a perovskite light-emitting device of claim 13,
 wherein a formation of the perovskite thin film comprises,
 applying a perovskite nanocrystalline particle solution on the first electrode;
 allowing a holding time (waiting time) or drying time to the perovskite nanocrystalline particle solution applied on the first electrode; and
 spinning the perovskite nanocrystalline particle solution through a spin coater to perform spin coating after the holding time is over.

15. The method of manufacturing a perovskite light-emitting device of claim 14, wherein the holding time is 2 minutes to 50 minutes.

16. The method of manufacturing a perovskite light-emitting device of claim 12, wherein the perovskite thin film is formed through bar coating.

17. The method of manufacturing a perovskite light-emitting device of claim 16,
 wherein the bar coating process comprises,
 applying a perovskite nanocrystalline particle solution on the first electrode;
 tilting the first electrode that is applied the perovskite nanocrystalline particle solution by giving an inclination angle with respect to the horizontal plane; and performing bar coating of the perovskite nanocrystalline particle solution on the tilted first electrode.

18. The method of manufacturing a perovskite light-emitting device of claim 17, wherein the holding time is given after the step of giving the perovskite nanocrystalline particle solution.

19. The method of manufacturing a perovskite light-emitting device of claim 12, wherein the passivation layer contains Formula 5below:

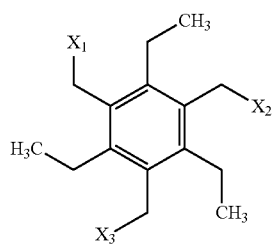

Formula 5

In Formula 5, X1, X2 or X3 is F, Cl, Br or I.

20. The method of manufacturing a perovskite light-emitting device of claim 12,
wherein the organic semiconductor includes at least one selected from Tris-(8-hydroxyquinoline) aluminum (Alq3), 3-(4-Bipenylyl)-4-phenyl-5-tert-butylphenyl-1,2,4-triazole (TAZ), Tris-Phenylquinoxalines 1,3,5-tris [(3-phenyl-6-trifluoromethyl) quinoxaline-2-yl] benzene (TPQ1), Tris-Phenylquinoxalines 1,3,5-tris [{3-(4-tert-butyl)-6-trifluoromethyl} quinoxaline-2-yl] benzene (TPQ2), 4,7-diphenyl-1,10-phenanthroline (Bphen), 2,9-dimethyl-4,7-diphenyl-1,10-phenanthroline (BCP), 10-benzo[h] quinolinol-beryllium (BeBq2), (Bis(8-hydroxy-2-methylquinoline)-(4-phenylphenoxy) aluminum (BAlq), 4,4'-N,N'-Dicabazol-biphenyl (CBP), 9,10-di(naphthalene-2-yl)anthracene (AND), 4,4',4"-Tris(N-cabazolyl)triphenylamine (TCTA), 1,3,5-tris(N-phenylbenzimidazole-2-yl)benzene (TPBI), 3-tert-butyl-9,10-di(naphtha-2-il)anthracene (TBADN), (1,3,5-triazine-2,4,6-triyl) tris (benzene-3,1-dyle)tris (diphenylphosphine oxide), 2,4,6-tris[3-diphenylphosphinyl]phenyl-1,3,5-triazine (PO-T2T), Tris(2,4,6-trimethyl-3-(pyridin-3-yl)phenyl) borane (3TPYMB), 4,6-bis(3,5-di(pyridin-3-yl)phenyl)-2-methylpyrimidine (B3PYMPM), and 2-[4-(9,10-di-naphthalen-2-yl-anthracen-2-yl)-phenyl]-1-phenyl-1H-benzoimidazole (ZADN), and
wherein the polymer is at least one selected from poly (Methyl Methacrylate) (PMMA), poly (ethyl methacrylate) (PEMA), poly (butyl methacrylate (PBMA), poly (2-ethyl-2-oxazoline) (PEOXA), polyacrylamide (PAM), and polyethylene oxide (PEO).

21. The perovskite light-emitting device of claim 1, wherein the passivation layer further includes at least one of Formula 2-4,

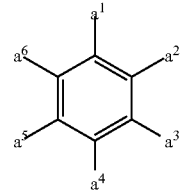

Formula 2 wherein, in Formula 2, a1 to a6 are each independently an alkyl group or alkoxy group having 1 to 10 carbon atoms, an alkenyl group or alkynyl group having 2 to 10 carbon atoms, a cycloalkyl group having 3 to 10 carbon atoms, a cycloalkenyl group or heteroalkenyl group having 3 to 10 carbon atoms, an aryl group or aryloxy group having 6 to 30 carbon atoms, a heteroaryl group having 2 to 30 carbon atoms, halogen, a halogenated alkyl group having 1 to 10 carbon atoms, a halogenated alkenyl or halogenated alkynyl group having 2 to 10 carbon atoms)

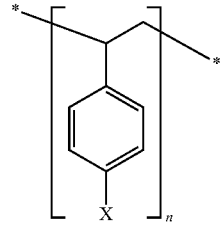

Formula 3 wherein, in Formula 3, X is halogen elements, and n is an integer from 1 to 100)

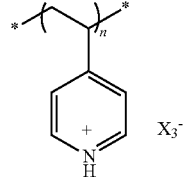

Formula 4 wherein, in Formula 4, X is halogen elements, and n is an integer from 1 to 100).

* * * * *